US008963618B2

(12) United States Patent
Keane et al.

(10) Patent No.: US 8,963,618 B2
(45) Date of Patent: Feb. 24, 2015

(54) RADIO FREQUENCY SWITCH WITH IMPROVED SWITCHING TIME

(71) Applicant: Ferfics Limited, Cork (IE)

(72) Inventors: John Keane, Co. Cork (IE); Ian O'Regan, Co. Cork (IE)

(73) Assignee: Ferfics Limited, Cork (IE)

( * ) Notice: Subject to any disclaimer, the term of this patent is extended or adjusted under 35 U.S.C. 154(b) by 0 days.

(21) Appl. No.: 13/893,939

(22) Filed: May 14, 2013

(65) Prior Publication Data

US 2014/0340137 A1    Nov. 20, 2014

(51) Int. Cl.
*H03K 17/687* (2006.01)
*H01H 11/00* (2006.01)

(52) U.S. Cl.
CPC .......... *H03K 17/6872* (2013.01); *H01H 11/00* (2013.01)
USPC ............ 327/434; 327/436; 327/437; 333/103

(58) Field of Classification Search
CPC ................................ H03K 17/687; H04B 1/44
USPC .......................... 327/434, 436–437; 333/103
See application file for complete search history.

(56) References Cited

U.S. PATENT DOCUMENTS

| 3,872,325 | A  | * | 3/1975 | Adams et al. ............... 327/389 |
| 7,020,453 | B2 | * | 3/2006 | Hidaka et al. ............... 455/333 |
| 7,659,770 | B2 | * | 2/2010 | Teraguchi et al. ........... 327/534 |
| 8,653,880 | B2 | * | 2/2014 | Tsukahara .................... 327/427 |
| 8,660,502 | B2 | * | 2/2014 | Wachi et al. .................. 455/83 |

\* cited by examiner

*Primary Examiner* — Kenneth Wells
(74) *Attorney, Agent, or Firm* — Tarolli, Sundheim, Covell & Tummino LLP

(57) ABSTRACT

A radio frequency (RF) switch which comprises an RF domain section having a plurality of RF switching elements. A DC domain section is provided having circuitry configured for controlling the RF switching elements in response to one or more control signals. A resistive load is provided between the RF domain section and the DC domain section. A bypass circuit is configured for selectively bypassing at least a portion of the resistive load.

39 Claims, 16 Drawing Sheets

RADIO FREQUENCY SWITCH WITH IMPROVED SWITCHING TIME

FIELD OF THE INVENTION

The present teaching relates to a Radio Frequency (RF) switch with improved switching time. In particular, the present teaching relates to an RF switch which selectively bypasses at least a portion of a resistive load between a DC domain section and an RF domain section at determined time periods.

BACKGROUND

The act of switching radio frequency signals in an integrated circuit is carried out by a Radio Frequency (RF) switch circuit. RF switches are well known in the art and provide a key building block in wireless systems. RF switches may be utilised in numerous applications such as mobile phones and wireless Local Area Networks (LANs). Such switches may include any number of switching elements which cooperate to control the flow of RF power between various circuit nodes. Performance metrics such as low insertion loss, high linearity, switching time, high isolation and power handling are critical in RF switch design.

Generally an RF switch does not consist of the RF switching circuit alone. Typically a RF switch system is comprised of two domains; an RF domain which includes the switching elements and a Direct Current (DC) domain which includes control logic, bias generation and power management circuitry. When the switch is operational, a high degree of isolation must be maintained between the RF and DC domains. Inadequate isolation between domains will compromise performance of the switch resulting in increased loss, reduced linearity, reduced power handling capability, reliability and operating lifetime may also be reduced.

The DC domain section of an integrated RF switch may include a negative voltage generator which typically consists of an oscillator, clock buffering and a switched capacitor charge pump. Full scale CMOS clock levels exist within the negative voltage generator resulting in the presence of tones at the oscillator fundamental frequency and its harmonics within the switch. The oscillator fundamental frequency is normally in the 1-10 MHz range where the upper limit is set by the requirement to restrict the frequency of large amplitude tones and the lower limit is set by the requirement to limit the voltage ripple on the switched capacitor charge pump output.

The presence of tones due to the negative voltage generator can limit the overall linearity and spurious output of the RF switch. Tones from the negative voltage generator can feed directly from the positive and negative supply references of the switch drivers through to the gate or body terminals of switching element transistors to the RF ports. The presence of tones from the negative voltage generator at the gate or body terminals of the switching element transistors may also result in the generation of intermodulation product tones when mixing occurs with an applied RF signal within switching element transistors. Mixing of tones from the negative voltage generator with the applied RF fundamental tone may also occur at circuit elements within the DC domain section because some of applied RF signal will couple into the DC domain section through the power supply, non-zero impedance on the ground connections, routing traces or other paths. Intermodulation product tones in the DC domain section can propagate to the switching element transistors limiting the linearity performance of RF switching element transistors.

Isolation filters are typically provided between the DC and RF domain sections on the path of the signals controlling the RF switching element transistors to limit the amplitude of spurious tones due to the presence of a switching CMOS clock signal in the DC section that may propagate into the RF domain section. The cut-off frequency of the low pass filter between the DC and RF domain sections is limited by the resistance value in the filter that may be tolerated before the switching time is impacted. The resistance value restriction in turn limits the attenuation of spurious tones that can be achieved by filters in conventional RF switch designs.

In applications where low spurious performance is required an external negative supply may have to be used to avoid spurious tones from the on-chip negative voltage generator. Switching time is a measure of how quickly a switch path can be turned on, i.e., transition from a high isolation off-state to a low impedance on-state, or how quickly a switch path can be turned off, i.e., transition from low impedance on-state to high isolation off-state. The switching element transistors provide a capacitive load to the drivers that in conjunction with the overall effective resistance on the control signal path to the switching element transistor produce an RC-time constant that limits how quickly the control voltage on the gate or body terminals may be adjusted. The switching time may be specified as the time from 50% transition on an external control pin to the time when an RF power signal at an output of a selected path reaches 90% of its final value for off-on transition. In other words, the switching time may be specified as the time from a 50% transition on an external control pin to a moment in time when an RF power signal at an output of a selected path reaches 10% of its final value for on-off transition. Targets for switching time may range from under 100 ns to 10 μs depending on the application.

There is therefore a need to provide an RF switch which addresses at least some of the drawbacks of the prior art.

SUMMARY

These and other problems are addressed by providing an RF switch which selectively bypasses at least a portion of a resistive load provided between a DC domain section and an RF domain section during determined time periods.

In one embodiment there is provided a radio frequency (RF) switch comprising an RF domain section having a plurality of RF switching elements; a DC domain section having circuitry configured for controlling the RF switching elements in response to one or more control signals; a resistive load provided between the RF domain section and the DC domain section; and a bypass circuit configured for selectively bypassing at least a portion of the resistive load.

In another embodiment, the resistive load comprises a resistor element. In one aspect at least one filter is provided which includes the resistor element. In a further aspect, the resistive load further comprises an equivalent resistance provided between an output node of the filter and a terminal of an RF switching element.

In one embodiment, the bypass circuit is selectively controlled for bypassing at least a portion of the resistive load at determined time periods. Preferably, the bypass circuit is selectively controlled for bypassing at least a portion of the resistive load when the one or more control signals are transitioning between logic states. In another aspect the bypass circuit is selectively controlled for bypassing the at least one filter at determined time periods. Advantageously, the bypass circuit is selectively controlled for bypassing the at least one filter when the one or more control signals are transitioning between logic states. In one embodiment, the bypass circuit comprises a detection stage for determining when to activate the bypass circuit. Advantageously, the detection stage is operable for detecting when the one or more control signals are transitioning between logic states. In an exemplary arrangement, the detection stage is operable for detecting when at least one signal derived from the one or more control signals is transitioning between logic states.

In another embodiment, the bypass circuit comprises a driver output stage. In an exemplary aspect, the DC domain section comprises a level shifting switch driver. In one aspect, at least a portion of the resistive load is operably coupled between the level shifting switch driver and the driver output stage. In another aspect, the at least one filter is operably coupled between the level shifting switch driver and the driver output stage.

In one embodiment, the driver output stage comprises at least one transistor. Advantageously, the driver output stage comprises at least one PMOS transistor stacked on at least one NMOS transistor. Ideally, the driver output stage comprises a first PMOS transistor and a first NMOS transistor. Preferably, the driver output stage comprises a second PMOS transistor and a second NMOS transistor. Advantageously, the first PMOS transistor and the first NMOS transistor are selectively controlled.

In another embodiment, a first logic element is associated with the first PMOS transistor and a second logic element is associated with the first NMOS transistor. Advantageously, the detection stage is configured to generate a bypass control signal which is derived from the one or more control signals for controlling the first PMOS transistor and the first NMOS transistor. Ideally, the output from the first logic element drives the gate of the first PMOS transistor. Preferably, the output from the second logic element drives the gate of the first NMOS transistor. In an exemplary arrangement, the gates of the second PMOS transistor and the second NMOS transistor are operably coupled to a ground reference node.

In an exemplary arrangement, at least a portion of the resistive load is operably coupled to a node intermediate a pair of stacked transistors in the driver output stage. In one aspect, an output node of the at least one filter is operably coupled to a node intermediate a pair of stacked transistors in the driver output stage. Advantageously, an output node of the at least one filter is operably coupled to a node intermediate the second PMOS transistor and the second NMOS transistor.

In another aspect, the at least one filter is configured for rejecting frequency components in a predetermined range. Preferably, the at least one filter is configured for rejecting frequency components that are greater than or equal to 1 MHz. Advantageously, the at least one filter comprises at least one resistive load and at least one capacitive load which are sized for rejecting frequency components in a predetermined range. Ideally, the at least one resistive load is sized independently of a switching time associated with the RF switch.

In one embodiment, the detection stage comprises one or more logic gates. Advantageously, the logic gates are configured to implement an exclusive OR gate function. Ideally, the detection stage further comprises a flip flop. Preferably, the detection stage is configured to generate a state change detect signal from the one or more control signals. In an exemplary arrangement, the state change detect signal provides a clock signal to the flip flop.

In another embodiment, the detection stage further comprises a reset circuit operably coupled in a feedback loop of the flip flop for generating a reset signal derived from an output signal of the flip flop. Preferably, the detection stage comprises one or more delay elements for generating one or more delayed control signals. Ideally, the state change detect signal is derived from one or more control signals and one or more delayed control signals.

In an exemplary arrangement, the DC domain section comprises an oscillator for generating a clock signal, the oscillator includes a biasing stage having a variable resistive load configurable for varying the frequency of the clock signal during determined time periods. Advantageously, the variable resistive load includes at least one resistive element that is selectively shorted out during determined time periods.

The present teaching also relates to a semiconductor substrate having an RF switch circuit fabricated thereon, wherein the RF switch circuit comprises: an RF domain section having a plurality of RF switching elements; a DC domain section having circuitry configured for controlling the RF switching elements in response to one or more control signals; a resistive load provided between the RF domain section and the DC domain section, and a bypass circuit configured for selectively bypassing at least a portion of the resistive load.

In one aspect, the semiconductor substrate comprises a silicon-on-insulator arrangement.

The present teaching further relates to a method of fabricating an RF switch circuit, the method comprising: providing an RF domain section having a plurality of RF switching elements on a semiconductor substrate; providing a DC domain section on the semiconductor substrate having circuitry configured for controlling the RF switching elements in response to one or more control signals; providing a resistive load between the RF domain section and the DC domain section on the semiconductor substrate, and providing a bypass circuit on the semiconductor substrate which is configured for selectively bypassing at least a portion of the resistive load.

In one embodiment a radio frequency (RF) switch is provided which comprises: an RF domain section having a plurality of RF switching elements; a DC domain section having circuitry configured for controlling the RF switching elements in response to one or more control signals; wherein the DC domain section comprises an oscillator for generating a clock signal, the oscillator includes a biasing stage having a variable resistive load which is configurable for varying the frequency of the clock signal during determined time periods, and a detection section configured for determining when to vary the frequency of the clock signal.

In another aspect there is provided a radio frequency (RF) switch which comprises: an RF domain section having a plurality of RF switching elements; a DC domain section having circuitry configured for controlling the RF switching elements in response to one or more control signals; at least one filter operably coupled between the RF domain section and the DC domain section, a first driver output stage being operably coupled to an input node of the at least one filter, a second driver output stage being operably coupled to an output node of the least one filter; and a bypass circuit configured for selectively bypassing the at least one filter.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

The present teaching will now be described with reference to some exemplary RF switches. It will be understood that the exemplary RF switches are provided to assist in an understanding of the present teaching and are not to be construed as limiting in any fashion. Furthermore, circuit elements or components that are described with reference to any one Figure may be interchanged with those of other Figures or other equivalent circuit elements without departing from the spirit of the present teaching.

Figure 1:
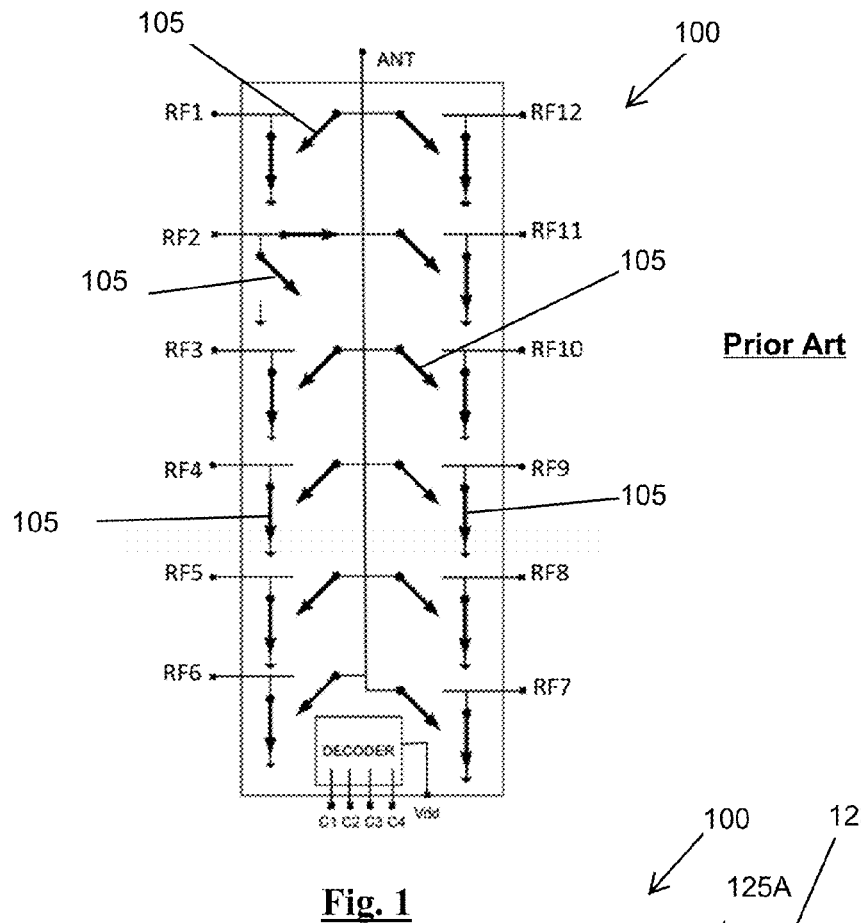
FIG. 1 is a circuit diagram of an exemplary RF switch.
Figure 2:
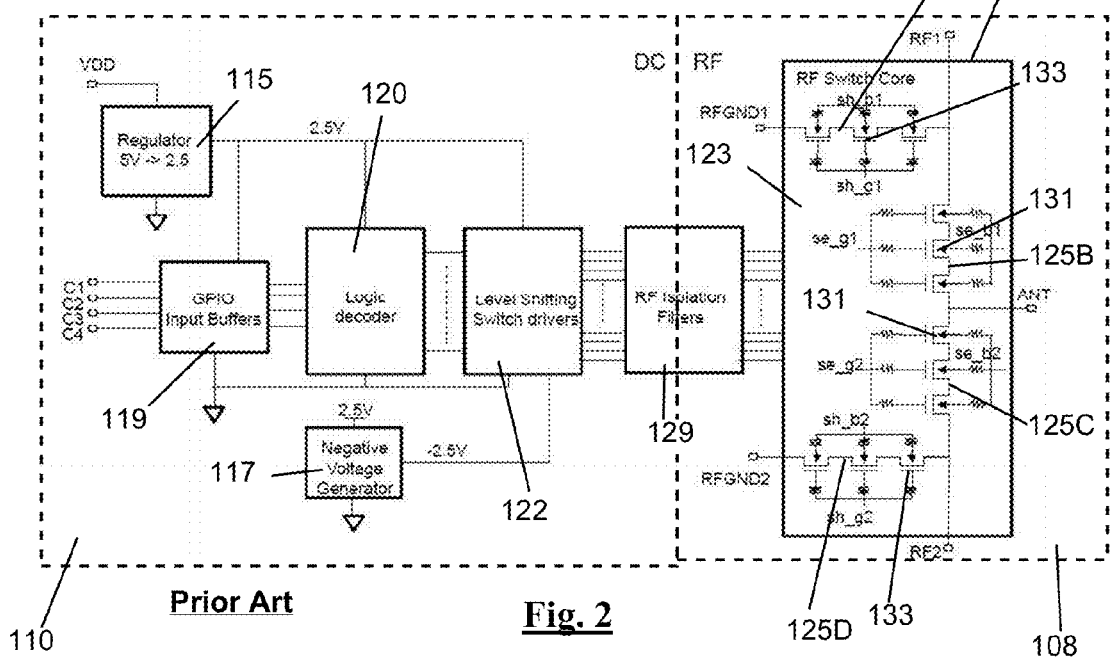
FIG. 2 is a block diagram of an exemplary RF switch.

In advance of describing a radio frequency (RF) switch in accordance with the present teaching an exemplary RF switch 100 is first described with reference to FIGS. 1 to 9. The circuit elements described with reference to the RF switch 100 provide the basic circuit blocks of a traditional RF switch. The RF switch 100 comprises a plurality of switching elements 105 which are operably configured to control the flow of RF power signals between circuit nodes. The RF switch 100 includes two domains; namely, an RF domain section 108 and a direct current (DC) domain section 110 as illustrated in FIG. 2. The DC domain section 110 may comprise one or more digital logic, bias generation, filter, memory, interface, driver and power management circuitry. In the exemplary RF switch 100 the DC domain consists of 5V to 2.5V regulator 115, a negative voltage generator 117, input buffers 119, logic decoder 120 and level-shifting switch drivers 122. These circuits are operably configured to generate the required bias levels, provide power management support and control selection of active switch path through which RF power flows depending on the values set on the control pins C1-C4. Such RF switches are well known in the art.

Figure 3:
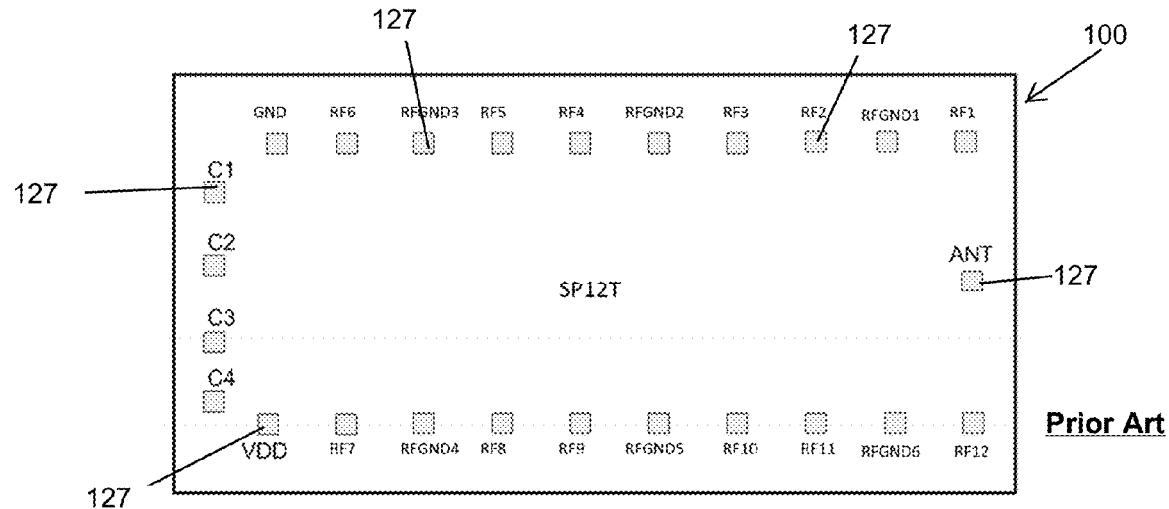
FIG. 3 is pin out diagram of an exemplary RF switch.

The RF domain section 108 comprises a switch core 123 which in the exemplary arrangement includes two series-shunt switch elements 125A-125D. A plurality of transistors 131, 133 are stacked in the switch elements 125A-125D to divide the RF voltage evenly across the transistors so that the voltage between any two terminals of the individual transistors during operation do not exceed a level that may cause performance degradation or damage to the device. RF isolation filters 129 are placed on signal lines controlling the switch gate and body terminals of the transistors 131,133 at the boundary between the RF domain section 108 and the DC domain section 110. In the exemplary arrangement, the RF switch 100 is provided as single-pole, twelve throw (SP12T) RF switch having input/out pins 127 as illustrated in FIG. 3. A description of the pins 127 is detailed in table 1 below.

TABLE 1

| Pin Name | Description |
| --- | --- |
| RF1 | RF Port |
| RFGND1 | RF Ground reference for shunt transistor connecting to RF1 & RF2 Ports |
| RF2 | RF Port |
| RF3 | RF Port |
| RFGND2 | RF Ground reference for shunt transistor connecting to RF3 & RF4 Ports |
| RF4 | RF Port |
| RF5 | RF Port |
| RFGND3 | RF Ground reference for shunt transistor connecting to RF5 & RF6 |
| RF6 | RF Port |
| GND | Ground reference for DC domain |
| C1 | Control input, C1-C4 decoded to select which of RF1-RF12 to ANT paths is active |
| C2 | Control input, C1-C4 decoded to select which of RF1-RF12 to ANT paths is active |
| C3 | Control input, C1-C4 decoded to select which of RF1-RF12 to ANT paths is active |
| C4 | Control input, C1-C4 decoded to select which of RF1-RF12 to ANT paths is active |
| VDD | Supply Voltage for DC domain |
| RF7 | RF Port |
| RFGND4 | RF Ground reference for shunt transistor connecting to RF7 & RF8 |
| RF8 | RF Port |
| RF9 | RF Port |
| RFGND5 | RF Ground reference for shunt transistor connecting to RF9 & RF10 |
| RF10 | RF Port |
| RF11 | RF Port |
| RFGND6 | RF Ground reference for shunt transistor connecting to RF11 & RF12 |
| RF12 | RF Port |
| ANT | Antenna Port, RF Common Port |

Figure 4:
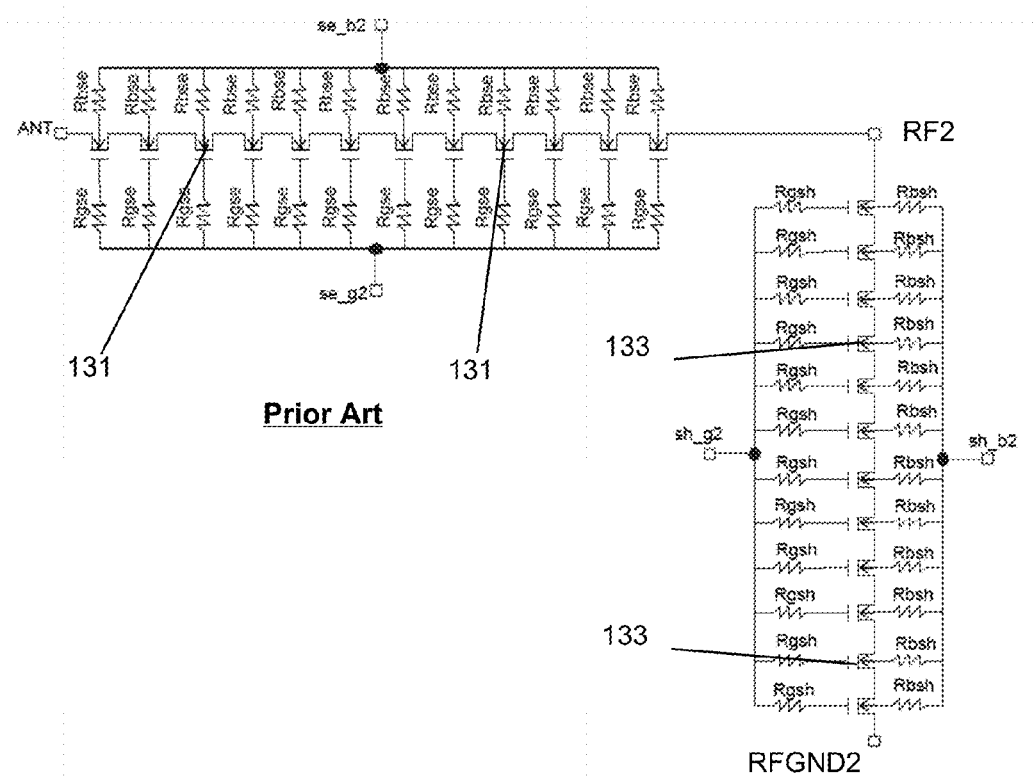
FIG. 4 is a schematic circuit diagram of a detail of the RF switch of FIG. 2.

FIG. 4 shows more detail of the switch core 123 of FIG. 2. The switch core 123 includes a plurality of series transistor elements 131 and a plurality of shunt transistor elements 133. The series transistor elements 131 are in a stacked configuration operably coupled between the antenna node ANT and the RF2 node. The shunt transistor elements 133 are in a stacked configuration operably coupled between the RF2 node and RFGND2 node. The number of transistors in a stack is determined by the maximum RF voltage level that can be experienced on the RF nodes when the switch is operational. A stack of 10-13 transistor devices is common for maximum RF voltages that can be experienced at GSM transmit power levels.

Figure 5:
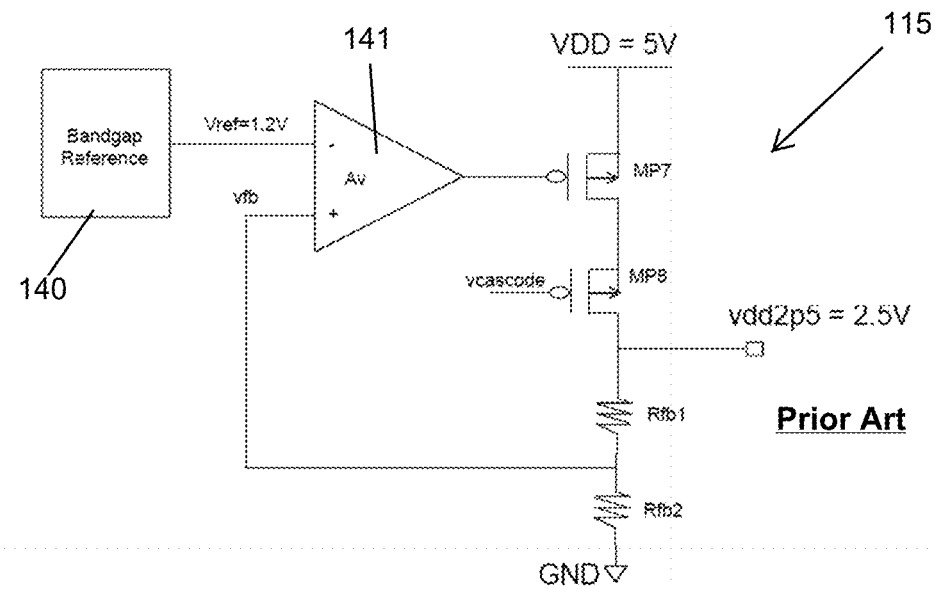
FIG. 5 is a schematic circuit diagram of a detail of the RF switch of FIG. 2.

The voltage regulator 115 of the switch 100 is illustrated in more detail in FIG. 5. The voltage regulator 115 comprises a bandgap reference 140 operably coupled to an input terminal of an op-amp 141. A pair of mosfet transistors MP7, MP8 and a pair of resistors Rfb1, Rfb2 are stacked between a VDD node and a ground reference node. The output from the op-amp 141 drives the MP7 transistor. The gate of the MP8 transistor is operably coupled to a reference voltage source vcascode. A feedback loop is provided from a node intermediate Rfb1 and Rfb2 and an input terminal to the op-amp 141. The voltage regulator 115 is configured to provide a regulated voltage level at a node Vdd2p5. In the exemplary mange arrangement the voltage at the node vdd2p5 is +2.5V.

Figure 6:
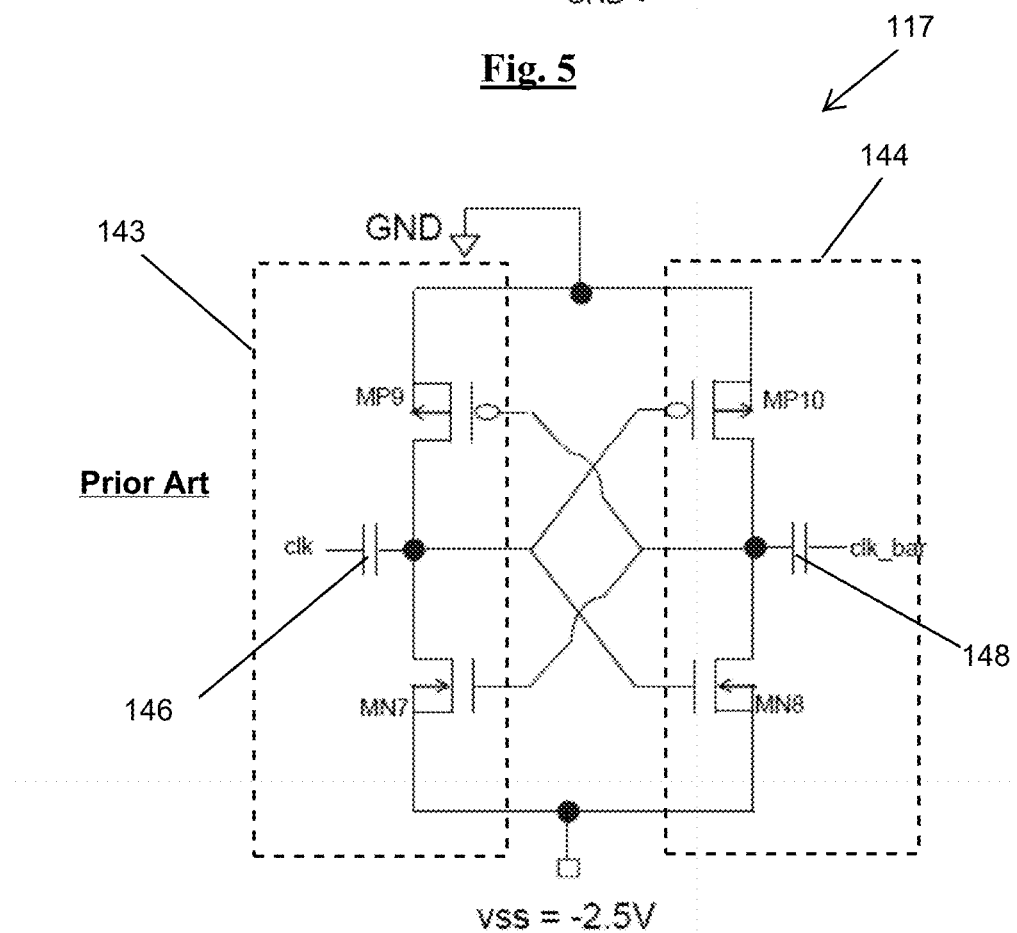
FIG. 6 is a schematic circuit diagram of a detail of the RF switch of FIG. 2.

The negative voltage generator 117 of the switch 100 is illustrated in more detail in FIG. 6. The negative voltage generator 117 comprises a first segment 143 and a second segment 144. The first and second segments 143, 144 are operably coupled between a ground reference node GND and a vss node. The first segment 143 comprises a PMOS transistor MP9 stacked on an NMOS transistor MN7. A first capacitor 146 which receives a clock signal clk is coupled intermediate MP9 and MN7. The second segment 144 comprises a PMOS transistor MP10 stacked on an NMOS transistor MN8. A second capacitor 148 which receives an inverse clock signal clk_bar is coupled intermediate MP10 and MN8. The gates of MP9 and MN7 are driven by the inverse clock signal clk_bar. The gates of MP10 and MN8 are driven by the clock signal clk. The negative voltage generator 117 is configured to provide a negative voltage at the node vss. In the exemplary arrangement the negative voltage which is provided at node vss is 2.5V.

Figure 7:
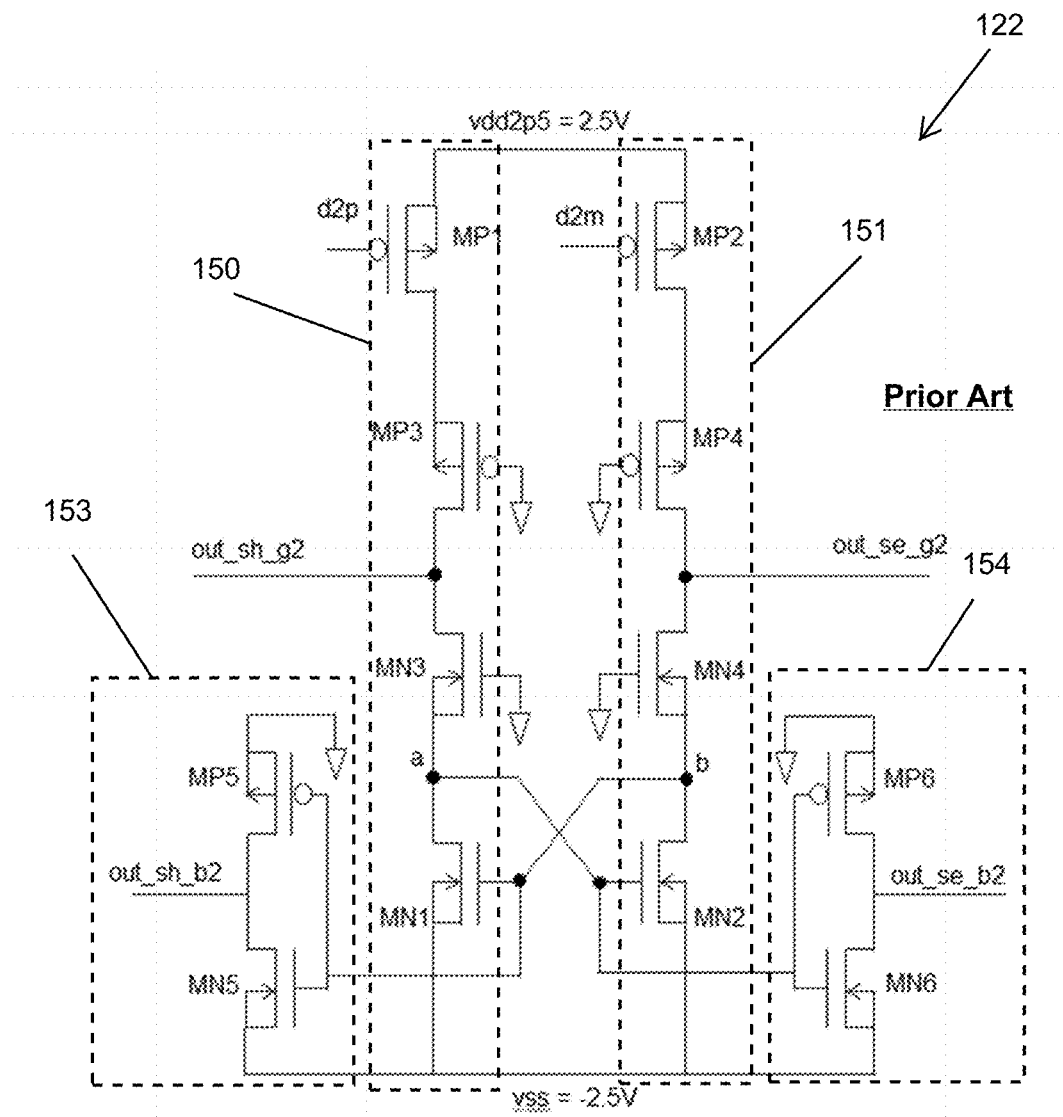
FIG. 7 is a schematic circuit diagram of a detail of the RF switch of FIG. 2.

The level shifting switch driver 122 of the switch 100 is illustrated in more detail in FIG. 7. The switch driver 122 comprises a first switch segment 150 and a second switch segment 151, which are operably coupled between the vdd2p5 node of the 5V-2.5V regulator 115 and the negative voltage node vss of the negative voltage generator 117. In the exemplary arrangement, the first switch segment 150 comprises a pair of PMOS transistors MP1 and MP3 and a pair of NMOS transistors MN3 and MN1. The second switch segment 151 comprises a pair of PMOS transistors MP2 and MP4 and a pair of NMOS transistors MN4 and MN2. The first switch segment 150 is associated with a first CMOS inverter 153 that includes a PMOS transistor MP5 and an NMOS transistor MN5 operably coupled between the vss node and a ground node. The second switch segment 151 is associated with a second CMOS inverter 154 that includes a PMOS transistor MP6 and an NMOS transistor MN6 operably coupled between the vss node and a ground node. The level shifting switch driver 122 is configured to provide four output drive signals which are outputted at nodes out_sh_g2, out_sh_b, out_se_g2 and out_se_b2. These drive signals are then filtered by the RF isolation filters 129 and the filtered versions of the signals are used to drive the series-shunt switch elements 125A-125D in the switch core 123 of the RF section 108.

Figure 8:
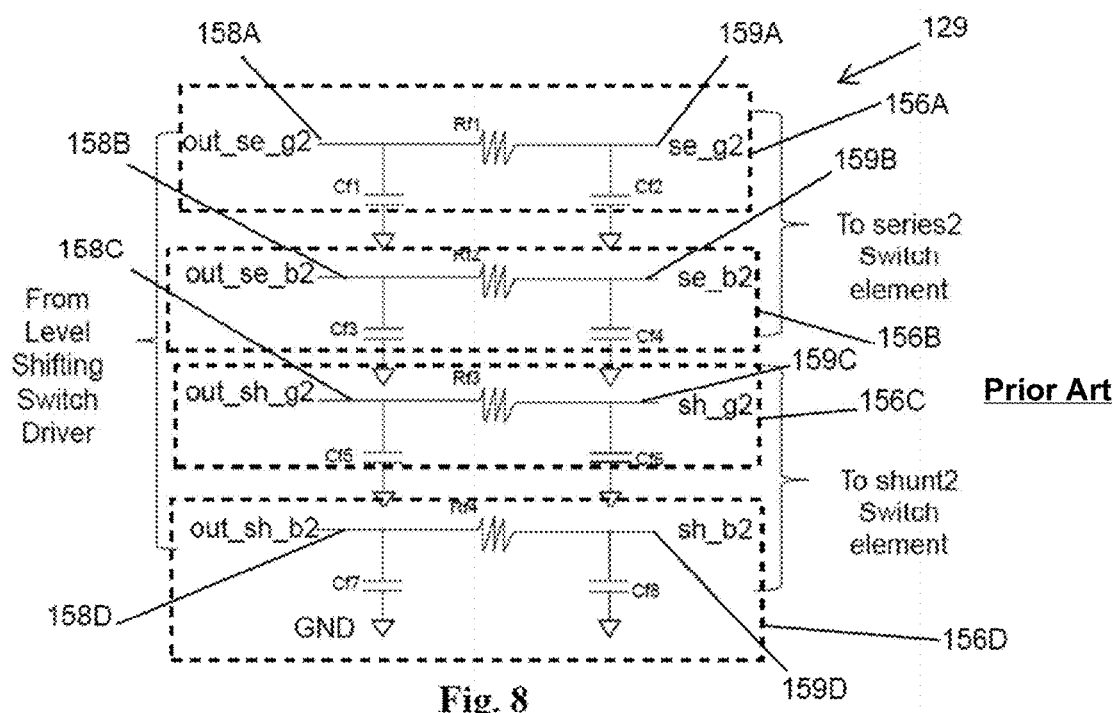
FIG. 8 is a schematic circuit diagram of a detail of the RF switch of FIG. 2.

The RF isolation filters 129 of the switch 100 are illustrated in more detail in FIG. 8. The RF isolation filters 129 are provided in an interface section operably between the DC domain section 110 and the RF domain section 108. In the exemplary arrangement, four filter segments 156A-156D are provided. For brevity, only the filter segment 156A is described. However, it will be appreciated by those of ordinary skill in the art that each of the filter segments 156B to 156D operates in a similar fashion to the filter segment 156A. The filter segment 156A includes a pair of capacitors Cf1 and Cf2 with a resistor Rf1 operably coupled there between. An input node 158A and an output node 159A are provided at respective opposite ends of the resistor Rf1. The capacitors Cf1 and Cf2 each have a first terminal coupled to a ground node. The second terminal of the capacitor Cf1 is coupled to the input node 158A, and the second terminal of the capacitor Cf2 is coupled the output node 159A. The input node 158A receives a drive signal from the node out_se_g2 of the level shifting switch drivers 122 and the output node 159 provides a filtered signal from the node se_g2 which drives the gate terminals of the series switch element 125C in the RF switch core 123 of FIG. 2. Thus the signal from node se_g2 is a filtered representation of the signal from node out_se_g2. In the exemplary arrangement, the filter segment 156B outputs a filtered signal from the node se_b2 which is derived from the signal from node out_se_b2. The filtered signal from the node se_b2 is used to drive the body terminals of the series switch element 125C in the RF switch core 123. The filter segment 156C outputs a filtered signal from node sh_g2 that is derived from the signal of node out_sh_g2. The filtered signal from the node sh_g2 drives the gate terminals of the shunt switch element 125D in the RF switch core 123. The filter segment 156D outputs a filtered signal from the node sh_b2 which is derived from the signal of node out_sh_b2. The filtered signal from the node sh_b2 drives the body terminals of the shunt switch element 125D in the RF switch core 123.

Figure 9:
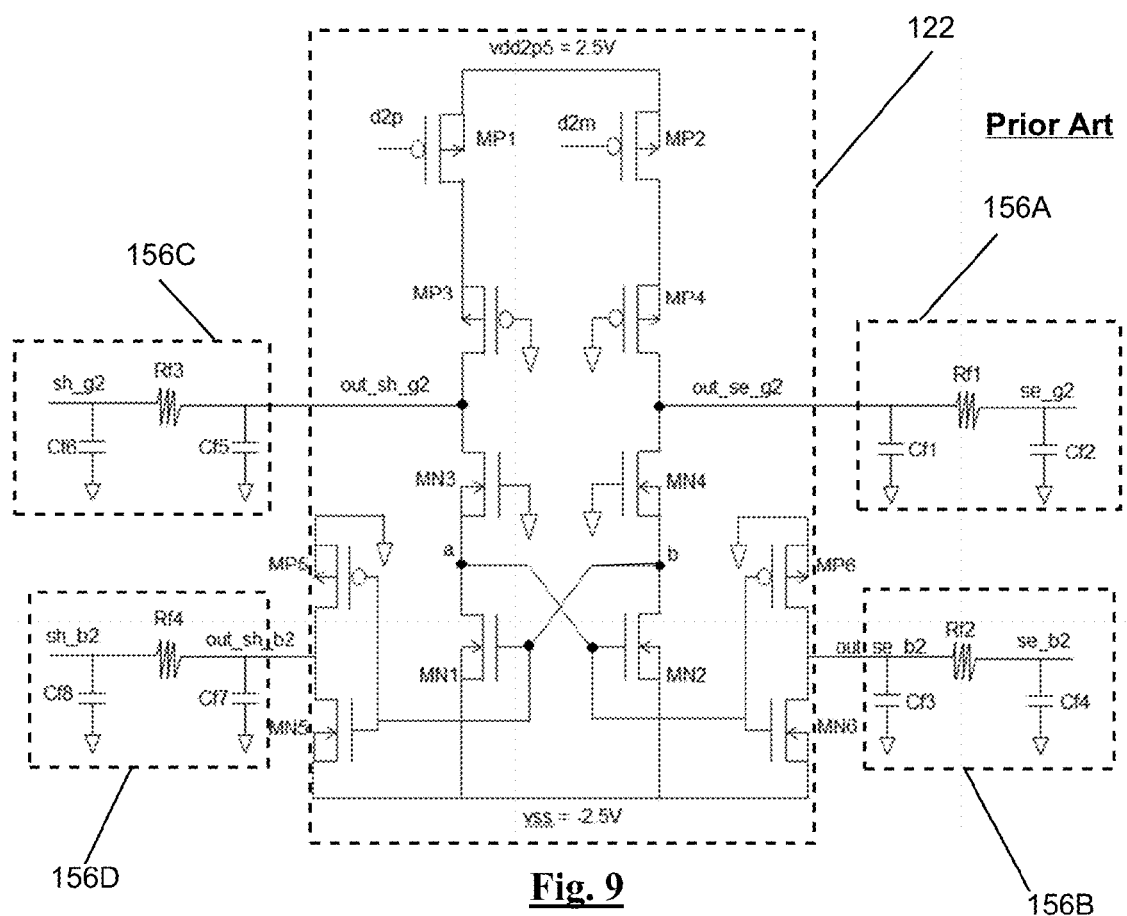
FIG. 9 is a schematic circuit diagram of a detail of the RF switch of FIG. 2.
Figure 10:
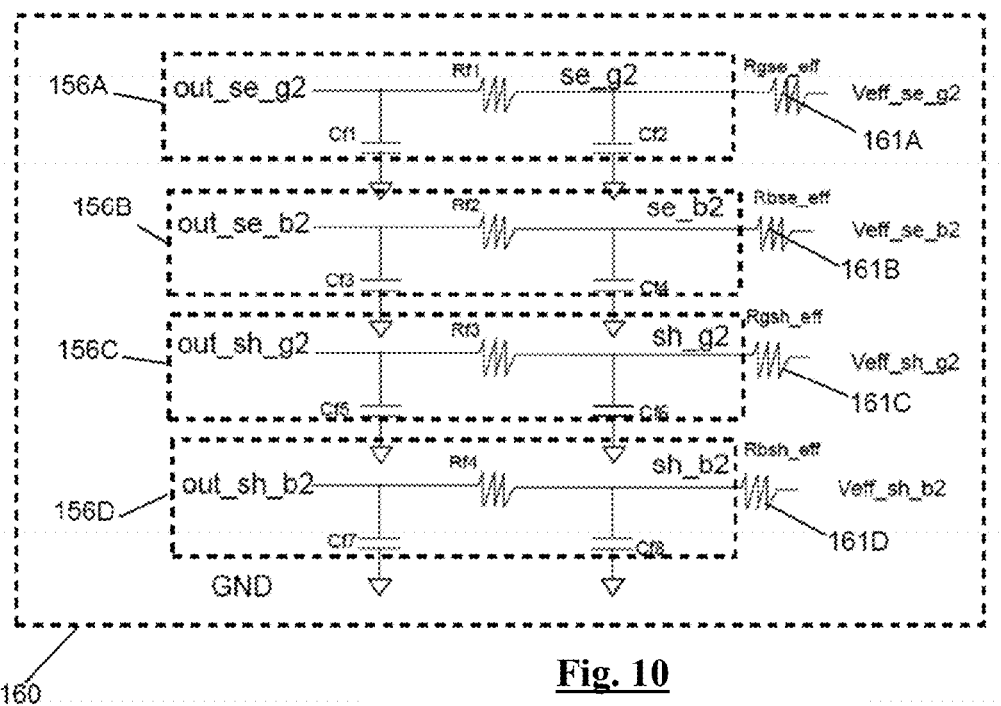
FIG. 10 is an equivalent circuit of the RF isolation filters of FIG. 8.

FIG. 9 illustrates the RF isolation filters 156A-156D operably coupled to the output nodes of the level shifting switch drivers 122. The schematic of FIG. 9 combines the circuit diagrams of FIGS. 7 and 8. An equivalent circuit 160 of the interface between the DC domain section 110 and the RF domain section 108 is illustrated in FIG. 10. The circuit 160 is substantially similar to the circuit of FIG. 8 and like components are indicated by similar reference numerals. An additional resistor element 161 is provided on each filter segment 156 which represents the effective resistance connecting to the gate and body terminals of the transistor elements 131, 133 in the RF switch core 123 of FIG. 2. Consider for example the top filter segment 156A between nodes out_se_g2 and se_g2. To turn on a transistor 131, 133 in the switching core 123 the voltage at the gate terminal of the transistor, Veff_se_g2 must transition from its low state, −2.5V, to high state, +2.5V. The rate at which this transition can occur is limited by time constant, τ, where:

$$\tau = (Rf1 + Rgse\_eff) * Cgate, \qquad \text{Equation 1}$$

Where:
Rgse_eff is the effective value of the resistances connected to the series element transistor gate terminals combined in parallel.
τ is a time constant.
Cgate is total MOSFET gate oxide capacitance, i.e. sum of gate to source and gate to drain capacitances.

For minimum insertion loss through the switching element it is desirable to maximise the value of Rgse_eff, but there is trade-off with regards to the value of Rf1 that can be tolerated to keep the time constant τ within the level required to achieve an efficient switching time.

Figure 11:
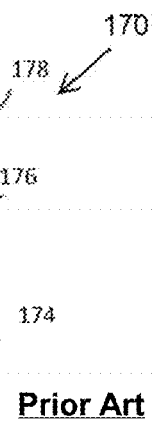
FIG. 11 is a cross sectional side view of a silicon-on-insulator structure on which the RF switch of FIG. 2 may be fabricated thereon.

Referring now to FIG. 11 which illustrates a typical silicon-on-insulator (SOI) structure 170 on which the RF switch 100 may be fabricated. In the exemplary arrangement, an insulating layer sits on top of a silicon substrate. A typical material for the insulating layer is silicon dioxide. In general SOI technologies consist of a bulk substrate 174, a buried oxide layer 176 and a thin active silicon layer 178. The bulk substrate 174 is generally a high resistivity substrate. The bulk substrate 174 can be either P-type or N-Type. A typical thickness for the bulk substrate is 250 μm. The buried oxide layer 176 is an insulator layer, typically silicon dioxide. A typical thickness of the buried oxide layer 176 is 1 μm. The active silicon layer 178 above the buried oxide layer 176 is typically of the order of 0.2 μm. The RF switch 100 may be fabricated in the silicon active area 178 using semiconductor processing techniques that are well known in the art and may include for example, but not limited to, deposition, implantation, diffusion, patterning, doping, and etching. The RF domain section 108 and the DC domain section 110 of the RF switch 100 are typically fabricated on a single semiconductor structure.

Figure 12:
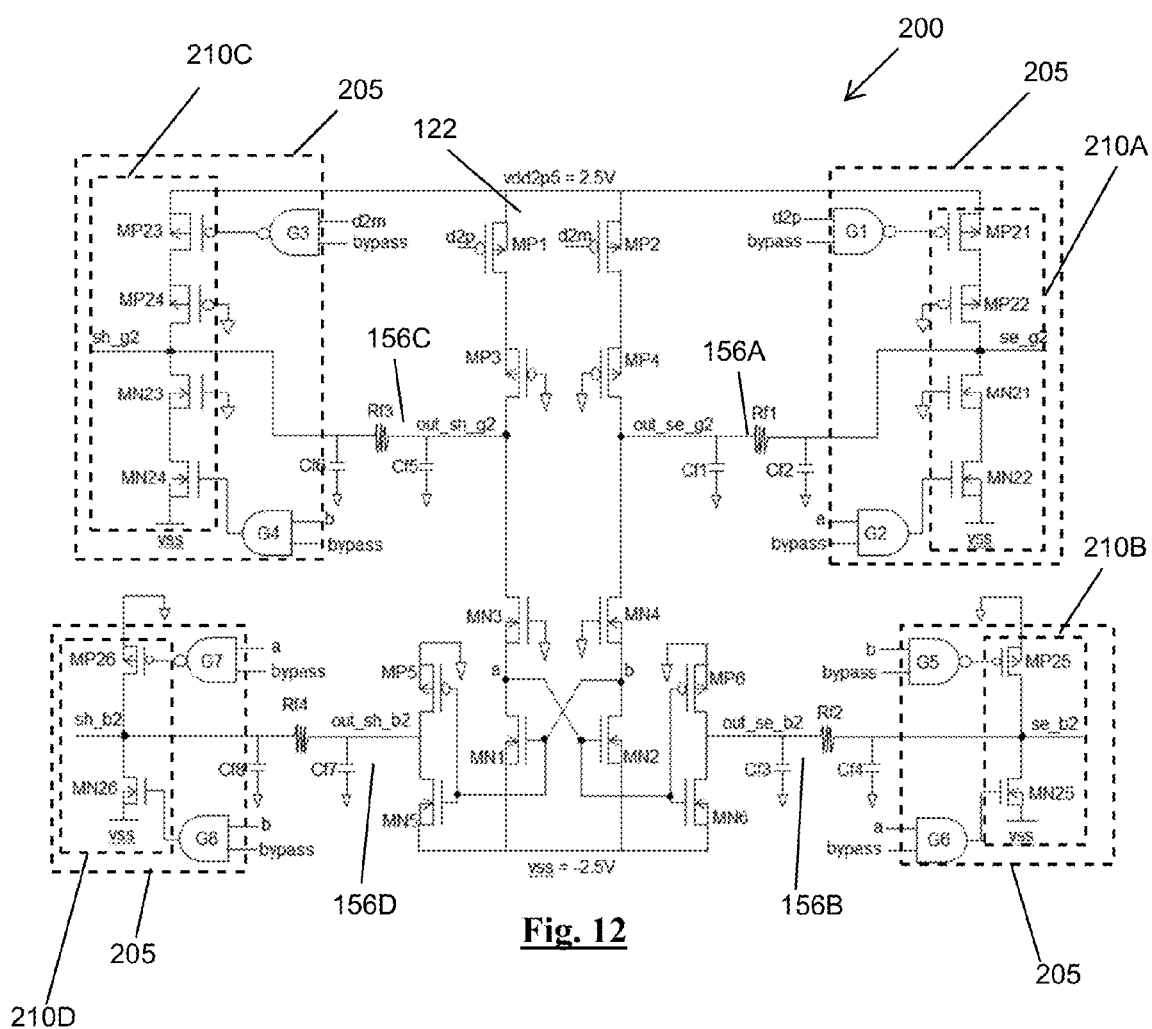
FIG. 12 is a schematic circuit diagram of an RF switch in accordance with the present teaching.

Referring now to FIG. 12 there is provided an RF switch 200 in accordance with the present teaching. The RF switch 200 includes similar circuits elements as previously described with reference to the RF switch 100, and like components are indicated by the same reference numerals. The present teaching addresses the drawbacks of prior art switches known heretofore by including a bypass circuit 205 which is used to improve the switching time performance of the RF switch 200. The circuit of FIG. 12 is similar to the circuit of FIG. 9 with the addition of the bypass circuit 205 which is selectively controlled to bypass at least a portion of a resistive load operably coupled between the DC domain section 108 and the RF domain section 110 at determined time periods during the operation of the RF switch 200. In the exemplary arrangement, the resistive load includes the individual resistor elements Rf1-Rf4 which are part of the RF isolation filters 156A-156D. However, it is not intended to limit the resistive load to the resistor elements Rf1-Rf4 as it may alternatively be provided by an equivalent resistive load 161A-161D of FIG. 10, for example, between an output node of the level shifting switch driver 122 and a terminal of an RF switching element 105. Furthermore, the resistive load may include one or more of the resistor elements Rf1-Rf4 and one or more of the equivalent resistive loads 161A-161D.

The bypass circuit 205 includes a driver output stage 210A-210D for providing a driver output signal and a detection stage 220 for determining when to bypass the filters 156A-156D. In the exemplary arrangement, the bypass circuit 205 is activated when one or more of the digital controlled signals C1-C4 on the inputs to the RF switch 200 are transitioning between logic states. The RF switch elements in the switch core 123 are selectively activated to route RF power along paths based on the values set on the control pins C1-C4 as would be understood by those skilled in the art. Alternatively, the bypass circuit 205 may be activated when one or more intermediate signals on the control paths which are derived from the digital controlled signals C1-C4 are transitioning between logic states. A high logic state would be understood to include a binary '1' state, and a low logic state would be understood to include a binary '0 state. Boolean logic states are well defined in the art.

The circuit schematic of FIG. 12 includes two types of driver output stages. The first type is indicated by reference numerals 210A and 210C. The second type is indicated by reference numerals 210B and 210D. It is envisaged that the driver output stage may include one or more transistors. In the exemplary arrangement, the driver output stage 210A includes first and second PMOS transistors MP21, MP22 stacked on first and second NMOS transistors MN21, MN22. It will be appreciated by those of ordinary skill in the art that the driver output stage may have alternative circuit configurations to those described in the exemplary arrangement. For example, the driver output stage 210B includes only a single PMOS transistor MP25 stacked on a single NMOS transistor MN25. Thus it is not intended to limit the present teaching to a particular type of driver output stage. The RF isolation filter 156A is operably coupled between the node out_se_g2 of the level shifting switch driver 122 and a node intermediate the second PMOS transistor MP22 and the second NMOS transistor MN21. The RF isolation switch element 156A which includes the resistive load Rf1 is bypassed by transistors MP21 and MP22 for low-high transition on the out_se_g2 node or by transistors MN21 and MN22 for high-low transition on the out_se_g2 node. The transistors that are used to bypass the filters are only enabled for the duration of switching and are normally off during regular operation of the RF switch 200. The duration for which the bypass transistors are on is controlled by the width of the control bypass signal pulse which is generated when a change of state is detected on the control signals C1-C4. As a consequence, the bypass transistors present a high impedance level to the nodes vdd2p5 and vss during regular operation. To transition the node out_se_g2 from the low state to the high state the gates of MP2 and MN2 are controlled to go to a low state to turn on MP2 and to turn off MN2. The gate of MP21 is pulled to the low state for the duration of the bypass control signal pulse which results in the MP21 transistor turning on. The gate of MP21 is controlled by appropriate logic elements to only turn on during a low to high state transition on the node out_se_g2 and remain off otherwise. In the exemplary arrangement, the gate of MP21 is controlled by a NAND operation which combines a d2p control signal and the bypass control signal. The d2p control signal is outputted from the logic decoder 120 which decodes the input control signals C1-C4 to determine which of the RF switching paths to activate. The transistor MN22 remains off during a low to high state transition on the node out_se_g2. To transition the node out_se_g2 from a high to low state the gates of MP2 and MN2 are controlled to go to a high state in order to turn off MP2 and turn on MN2. The gate of MN22 is pulled to a high state for the duration of the bypass control signal pulse which turns on the MN22 transistor. The gate of MN22 is controlled by appropriate logic to only turn on during a high to low state transition on the node out_se_g2 and remain off otherwise. In this example, the gate of MN22 is controlled by AND operation which combines a signal from the node 'a' and the bypass control signal. The transistor MP21 remains off during the high to low state transition on the out_se_g2 node.

The se_g2 node is now driven directly through the transistors of the driver output stage 210A and therefore it does not have to be charged or discharged through the filter resistor Rf1. Thus, the filter resistor Rf1 no longer influences the time constant of the switching time. This is equivalent to setting Rf1=0 in Equation (1) producing:

$$\tau' = Rgse\_eff * Cgate. \qquad \text{Equation 2}$$

As a result Rf1 may now be set independently of switching time requirement allowing much higher isolation to be achieved between the DC and RF domain sections during the operation of the RF switch 200. It will be appreciated that the other RF isolation filters 156B-156D may be bypassed in similar fashion to that described with reference to the filter 156A. Thus the bypass circuit 205 of the exemplary arrangement may be selectively operated to bypass one or more of the resistors Rf1-Rf4 of the filters 156A-156D.

In order to assist in an understanding of the present teaching the operation of FIG. 12 is described in more detail below. However, it is not intended to limit the present teaching to the exemplary operation which is provided by way of example only. In the exemplary embodiment, the control signals d2p and d2m from the logic decoder 120 are applied to the level shifting switch driver 122 which determine the output states of the nodes out_se_g2, out_sh_g2, out_se_b2 and out_sh_b2. The d2p and d2m control signals are 0V-2.5V logic levels and each is the inverse of the other. The level shifting switch driver 122 output nodes that control the gate terminals of the transistors 131, 133 in the RF switching elements, out_se_g2 and out_sh_g2 are −2.5V-+2.5V logic levels. The driver outputs that control the body terminals of the transistors 131, 133 in RF switching elements are −2.5V-0V logic levels. In the scenario the node out_se_g2 is required to transition from its low state, −2.5V, to its high state, +2.5V. This transition is initiated when the control signal d2p changes from its low state, 0V, to its high state, 2.5V, while an inverse transition occurs on the d2m control signal, i.e. d2m changes from its high state, 2.5V, to its low state, 0V. The change of state on the signals d2p and d2m causes the transistor MP1 to turn off and the transistor MP2 to turn on. When the transistor MP2 is turned on, node "b" is pulled up from its low state, −2.5V, towards its high state of approximately 0V. The two NMOS transistors MN1 and MN2 form a cross-coupled latch. As a result of node "b" being pulled up transistor MN1 begins to turn on, pulling node "a" from its high state, approximately 0V, towards its low state, −2.5V which in turn causes MN2 to turn off. The positive feedback action of the cross-coupled latch completes the switching on nodes "a" and "b" so that node "b" fully transitions to its high state, approximately 0V, and node "a" fully transitions to its low state, −2.5V. Therefore the transition from a low to high state on the node out_se_g2 is controlled by the gate voltage on MP2 and MN2 going to their respective low state causing MP2 to turn on and MN2 to turn off. The filter output, se_g2, follows the out_se_g2 transition but with a delay due to the filter also transitioning from its low state, −2.5V, to its high state, +2.5V.

Considering the scenario when the nodes out_se_g2 and se_g2 transition from a low to a high state. The bypass control signal is a positive polarity pulse that is asserted for a duration during the transition between states when the node out_se_g2 and se_g2 transition from a low to a high state. The gate of MP21 is controlled by the output of the NAND gate, G1. The input to the NAND gate G1 is the control signal d2p which is transitioning from a low to a high state and the bypass control signal pulse which is generated for the duration of the transitioning between logic states. As a consequence, the NAND gate, G1, outputs a low pulse for the duration of the bypass signal which turns on transistor MP21. The gate of MN22 is controlled by the output of the AND gate, G2. The input to the AND gate G2 is a signal derived from node "a" which is transitioning from a high state to a low state and the bypass control signal pulse which is generated for the duration of the logic state transition. One of the inputs to AND gate G2 is in a low state which results in the gate of MN22 remaining in a low state during the transition resulting in the transistor MN22 remaining off. As a result of MP21 turning on for the duration of the bypass control signal pulse the filter output se_g2 is pulled to its high state through MP22 and MP21. Once the state transition is complete and the bypass control signal pulse is de-asserted MP21 is turned off. Similar analysis can be applied for a switching sequence of opposite polarity or switching sequence on the other driver outputs. It will therefore be appreciated that the resistors Rf1-Rf4 of the filters 156A-156D are selectively bypassed when the one or more of the control signals C1-C4 or signals derived therefrom are transitioning between logic states. In the exemplary arrangement, the filters 156A-156D are configured for rejecting predetermined frequency components. For example, the filters 156A-156D may be configured for rejecting frequencies greater than or equal to 1 MHz. The resistors Rf1-Rf4 and capacitors Cf1-Cf8 in the filters 156A-156D are sized for rejecting frequency components in a predetermined range.

Figure 13:
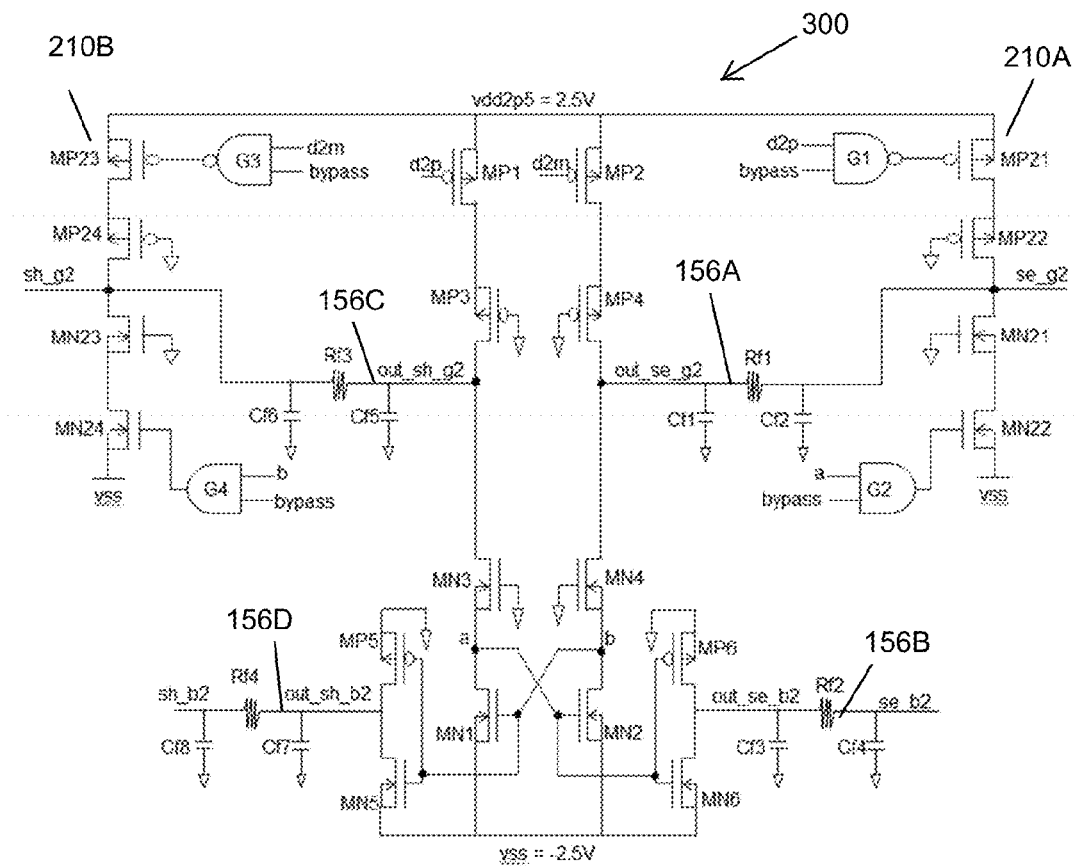
FIG. 13 is a schematic circuit diagram of an RF switch in accordance with the present teaching.

Referring now to FIG. 13, there is illustrated a further RF switch 300 which is also in accordance with the present teaching. The RF switch 300 is substantially similar to the RF switch 200, and like components are indicated by similar reference numerals. The RF switch 300 is configured such that only certain RF isolation filters are bypassed when the respective control signals are transitioning between binary logic levels. In the exemplary arrangement, filters 156A and 156C are selectively bypassed. Filters 156B and 156D do not have bypass circuitry associated with them. For instance it may not be necessary to bypass filters 156B, 156D which are provided on the control paths to the body terminals of the transistors 131, 133 in the switching core 123 because the capacitive load on these lines may be negligible and therefore may not significantly affect the switching time of the RF switch 300. It will therefore be appreciated that it is not intended to limit the present teaching such that the resistive load of each filter needs to be selectively bypassed. Depending on the application, it may be desirable to only have bypass circuitry associated with some of the filters in the RF switch.

Figure 14:
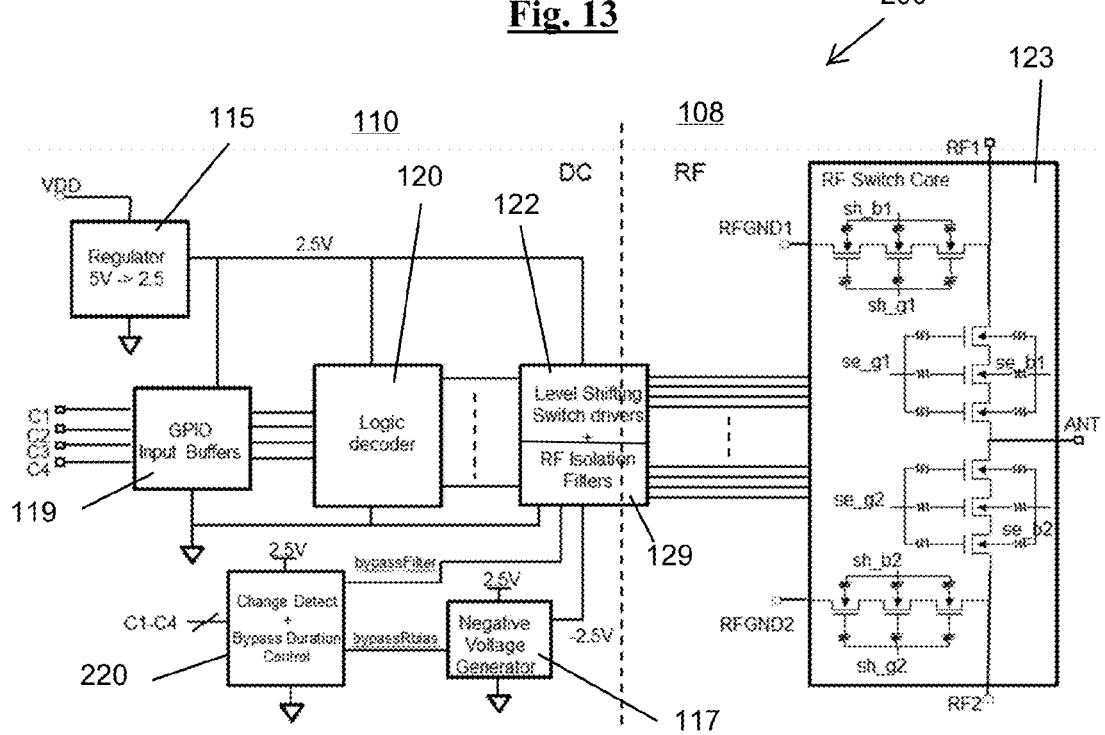
FIG. 14 is block level schematic diagram of an RF switch in accordance with the present teaching.
Figure 15:
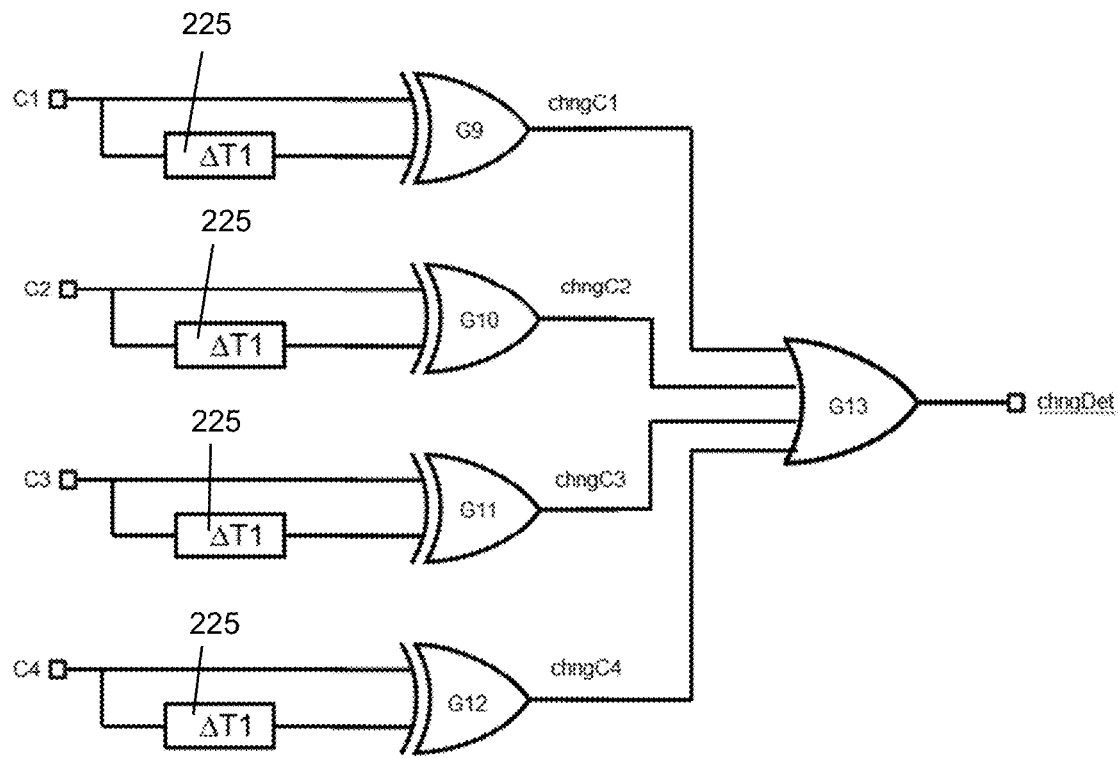
FIG. 15 is a schematic circuit diagram of a detail of the RF switch of FIG. 14.
Figure 16:
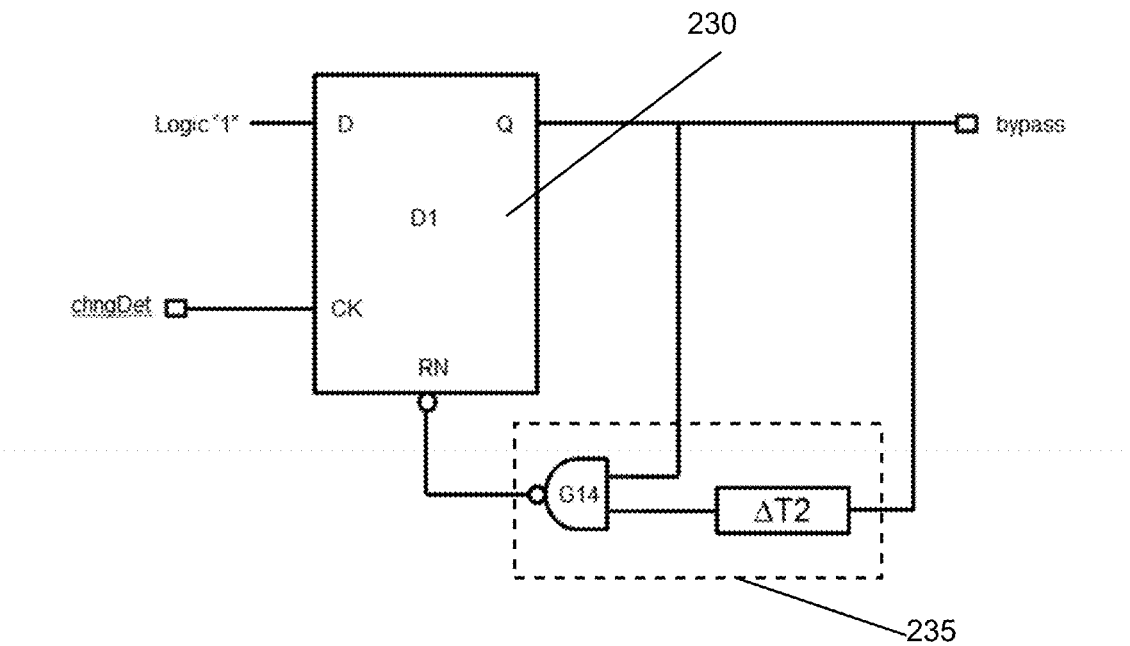
FIG. 16 is a schematic circuit diagram of a detail of the RF switch of FIG. 14.

Referring now to FIGS. 14-16, an exemplary detection stage 220 of the bypass circuit 210 is illustrated. The detection stage 220 is configured to detect a change of state on the controls signals C1-C4 and generate the bypass control signal which determines when the one or more of the filters 156A-156D are to be bypassed. In the exemplary arrangement, the detection stage 220 comprises a plurality of exclusive OR gates G9-G12 which drive an OR gate G13 as illustrated in FIG. 15. The inputs to the XOR gates G9-G12 include the control signals C1-C4 and delayed control signals C1'-C4'. The delayed control signals C1'-C4' are derived from the control signals C1-C4. Delay circuit elements 225 are operably coupled to the inputs of the XOR gates G9-G12 in order to generate the delayed control signals C1'-C4'. The duration of the delay is ΔT1. When the control signals C1-C4 change state a high polarity pulse is generated at the output of XOR gate for a duration of ΔT1. The duration of ΔT1 is typically several nanoseconds, and must be sufficient to provide a clock pulse for a D-flip flop 230. The logic gate arrangement of FIG. 15 may be used to detect a change of state on one or more of the control signals C1-C4. In the example, the detection stage 220 detects a state changes on each of the control signals C1-C4 and generates an appropriate change of state detection signal chngDet at the output of the OR gate G13. The change of state detection signal is a high logic level for a duration ΔT1 if any of C1-C4 changes state. A reset circuit 235 is operably coupled in a feedback loop between the output terminal Q of the flip flop 230 and a reset terminal RN. A logic level "1" is applied to the D-input of the flip flop 230 and is clocked through to the Q output terminal at positive edges of the change of state detection signal. The output signal from the Q terminal provides the bypass signal which is used to selectively control the driver output stage 210A-210D. Once the bypass control signal has transitioned to a high state it will remain at that level until the flip flop 230 is reset by setting the output of G1 to a low state. The duration of the bypass control signal is therefore controlled by ΔT2 which is set depending on the target switching time of the RF switch. This can be set by either RC delays or counting clock cycles and is typically of the order of 100's ns to 10 μs. It is envisaged that a change of state on one or more of the controls signals may be used to generate the change of state detection signal chngDet. Thus, in certain scenarios only the change of state on certain control signals may be used for selectively controlling the bypass circuit 205.

Figure 17:
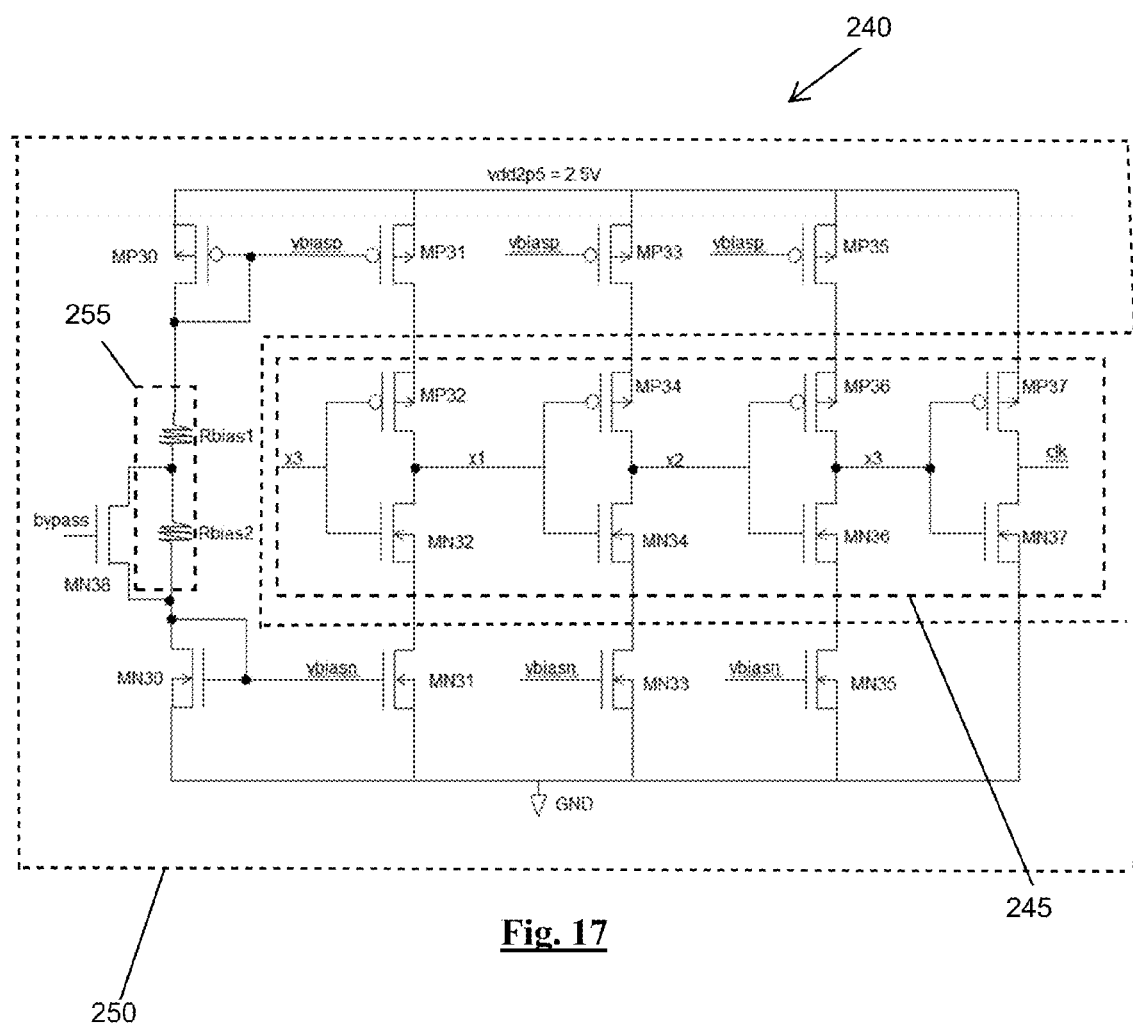
FIG. 17 is a schematic circuit diagram of a detail of the RF switch of FIG. 14.

Referring now to FIG. 17, there is illustrated an oscillator 240 which is part of the negative voltage generator 117 of FIG. 14. The oscillator 240 includes an oscillator core 245 which includes four current starved CMOS inverters which are configured to generate a clock signal clk. A biasing stage 250 is provided for biasing the CMOS inverters. The biasing stage 250 includes a variable resistive load 255. In the exemplary arrangement the variable resistive load 255 comprises a first resistor Rbias1 and a second resistor Rbias2. A switch element MN38 is configured to selectively short out the Rbias2 resistor in response to the bypass control signal. The speed at which the level shifting switch driver 122 can switch output states is influenced by the supply level across the driver, i.e. vdd2p5-vss. The vss reference is supplied by a switched capacitor negative voltage generator. During a transition of the level shifting switch driver 122 output state, the vss is temporarily discharged from its steady state value as a result of current draw from vss during the state transition. This reduces the effective supply level on the driver 122 which can prolong the time taken for the driver 122 to switch states. The switching time of the RF switch can then be dominated by the rate at which vss can be re-charged to its steady state value which is dependent on the frequency at which the negative voltage generator is clocked.

Optionally the frequency of the oscillator 240 driving the negative voltage generator 117 may also be increased when a state transition of the control signals C1-C4 is detected. The variable resistive load 225 is varied for controlling the frequency of the clock signal when the control signals are experiencing a state transition. In the exemplary arrangement, the frequency of the clock signal is increased during state transitions of the control signals C1-C4. The oscillator core 245 consists of three stages of current starved inverters, stage 1 formed by MP31, MP32, MN32 and MN31. Stage 2 is formed by MP33, MP34, MN34 and MN33. Stage 3 is formed by MP35, MP36, MN36 and MN35. The inverter stage formed by MP37 and MN37 produces a full-scale CMOS logic level clock output signal. The frequency of oscillation of the clock signal is controlled by the bias current through the current-starved inverter stages provided by the biasing stage 250. The bias current is determined by MP30, MN30, Rbias1 and Rbias2. The bias current level is approximately $$Ibias=(vdd2p5-|Vt(MP30)|-Vt(MN30))/(Rbias1+Rbias2) \quad \text{Equation 3}$$

Where:
Vdd2p5 is the regulated 2.5V supply voltage.
Vt(MP30) is threshold voltage of MP30.
Vt(MN30) is threshold voltage of MN30.
Rbias1 is a first bias resistance value.
Rbias2 is a second bias resistance value.
When a state transition occurs on the controls signals C1-C4, a bypass signal is generated to control the oscillator frequency. The bypass signal is generated in a similar fashion to that described with reference to FIGS. 15 and 16. In the exemplary arrangement the transistor MN38 operates as an NMOS switch which is controlled by the bypass signal in order to bypass the resistor Rbias2. Thus the resistor Rbias2 is shorted out when the bypass signal is pulsed high which switches on the transistor MN38. As a consequence, the oscillator bias current is increased to approximately:

$$Ibias'=(vdd2p5-|Vt(MP30)|-Vt(MN30))/Rbias1 \quad \text{Equation 4}$$

Where:
Vdd2p5 is the regulated 2.5V supply voltage.
Vt(MP30) is threshold voltage of transistor MP30.
Vt(MN30) is threshold voltage of transistor MN30.
Rbias1 is the first bias resistance value.
This increases the oscillator clock frequency during the state transition of one or more of the control signals C1-C4 which allow the negative voltage generator to return to its steady state value following disturbance at a faster rate preventing vss disturbance from limiting the switching time. Thus the switching time performance of the RF switch may be further improved.

The RF switches described with reference to FIGS. 12-17 may be fabricated on a semiconductor substrate. It is envisaged that the RF switches could be provided on a Silicon-On-Insulator structure similar to that described with reference to FIG. 11. The RF switches may be fabricated using semiconductor processing techniques that are well known in the art and may include for example, but not limited to, deposition, implantation, diffusion, patterning, doping, and etching. Since these semiconductor processing techniques are known in the art, it is not intended to describe them further. A person skilled in the art would understand how to fabricate the RF switches 200 and 300 on a substrate using these known techniques. The method may comprise providing an RF domain section 108 having a plurality of RF switching elements 105 on a semiconductor substrate 170. A DC domain section 110 is also provided on the semiconductor substrate 170 having circuitry configured for controlling the RF switching elements 105 in response to one or more control signals C-C4. At least one filter 156A-156D is operably coupled between the RF domain section 108 and the DC domain section 110 on the semiconductor substrate 170. A bypass circuit 110 is also provided on the substrate 170 which is configured for selectively bypassing the at least one filter 156A-156D.

The advantages of the present teaching are many and may be demonstrated by computer simulation using the single-pole, twelve throw (SP12T) RF switch 200 of FIG. 14. The simulation results are provided to give a better understanding of the present teaching, however, it is not intended to limit the present teaching to these exemplary results. In the example, the experimental setup monitors an active RF path connected to the antenna port ANT switching from the RF1 port to the RF2 port. The bypass circuit 205 is operably configured to bypass the resistive loads Rf1-Rf4 of any of the filters 156A-156D. In the experimental setup the values of the capacitors Cf1-Cf8 are identical and the values of the resistors Rf1-Rf4 are identical. The resistors Rf1-Rf4 in the filters 156A-156D have a value of 1.6MΩ. The effective value of resistance connected to the gate terminals on the series transistors 131 and the shunt transistors 133 in the switching core 123 is Rgse_eff=42 kΩ. The effective value of the capacitance presented at the gate terminals of the series and shunt transistors 131, 133 in the switching core 123 is Cgate=60 pF. As a consequence, the resultant RC time constant produced which governs the switching time as per equation 2 is τ'=2.5 μs.

Figure 18:
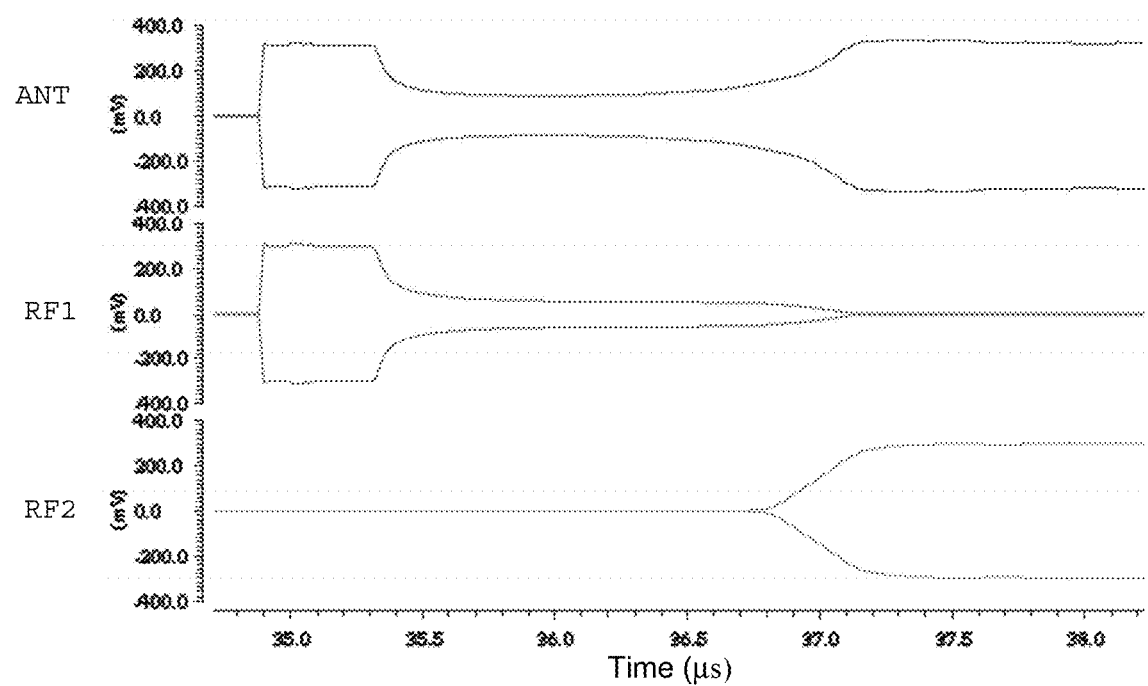
FIG. 18 is a graphical representation from a computer simulation which shows an envelope of RF signals at indicated ports of the RF switch of FIG. 14.

The simulation plots of FIG. 18 shows an envelope of the RF signal at the port Ant, RF1 and RF2. The upper plot is the RF signal voltage on the Antenna node Ant. The middle plot is the RF signal on the RF1 port transitioning from on to off. The bottom plot is the RF signal on the RF2 port transitioning from off to on. The control signal which controls the switching of the active path is applied at time t=35 μs. The RF signal at the RF2 port reaches 95% of its steady state voltage, corresponding to 90% RF of steady state power within 3 μs.

Figure 19:
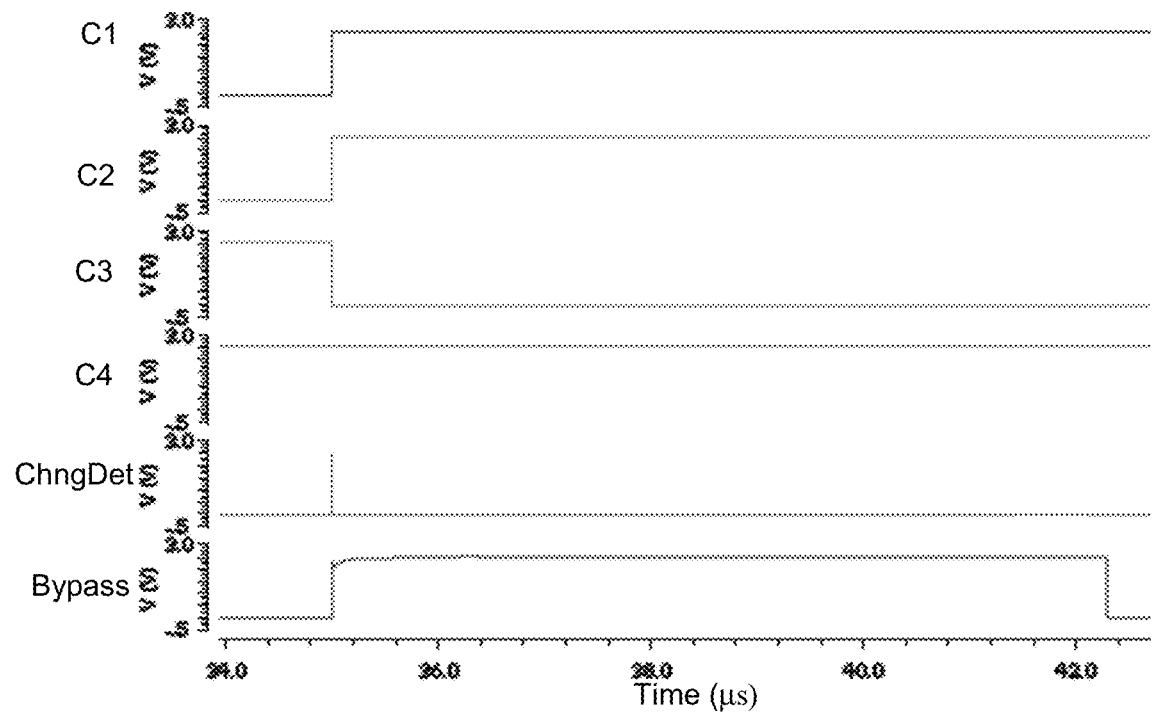
FIG. 19 is a graphical representation from a computer simulation which shows control signals transitioning between logic states.
Figure 20:
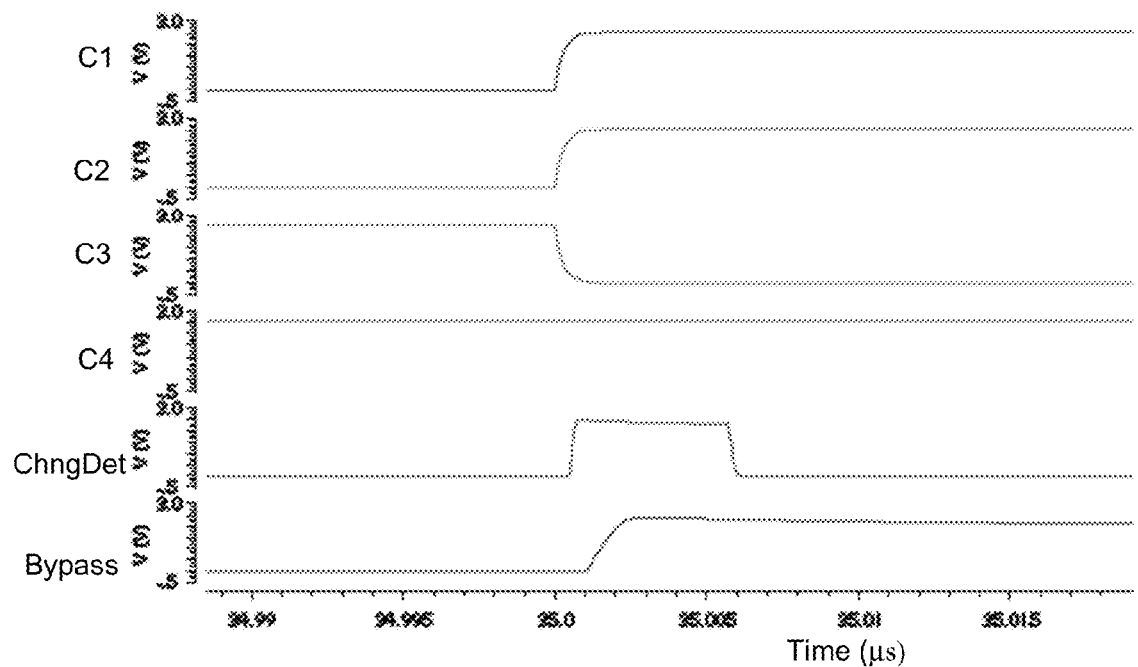
FIG. 20 is a graphical representation from a computer simulation which shows control signals transitioning between logic states.

The simulation plots of FIG. 19 illustrate the control signals C1-C4 changing state. As a consequence, the detection stage 220 of FIG. 15 generates a state change detect signal chngDet at time t=35 μs. The bypass signal which is outputted from the flip flop 230 of FIG. 16 is a square wave pulse that remains high for approximately 7 μs. This bypass signal is used to control the driver output stages 210A-210D in FIG. 12. The simulation plots of FIG. 20 are zoomed in versions of the plots of FIG. 19. The state change detect signal chngDet is generated at the 35 μs time mark on the x-axis for a duration of approximately 5 ns.

Figure 21:
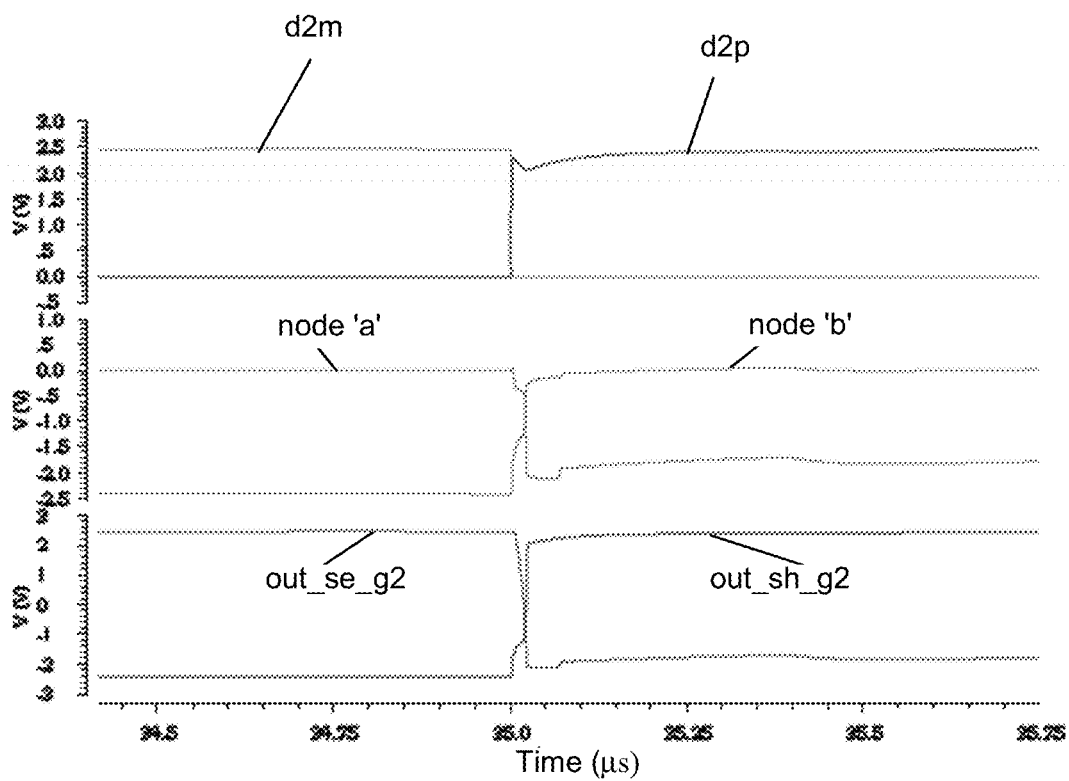
FIG. 21 is a graphical representation from a computer simulation which shows signals associated with the level shifting switch driver of FIG. 12.

The simulation plots of FIG. 21 illustrate the signals which control the logic state transition on the node out_se_g2 of the level shifting driver 122 going from a low state to a high state as a result of logic state changes on the control signals C1-C4 at the time mark t=35 μs on the x-axis. The top plot shows the control signal d2m which is applied to the MP2 transistor of FIG. 13 changing from a high state to a low state and the control signal d2p which is applied to the transistor MP1 changing from a low state to a high state at the time t=35 μs. The middle plot shows a signal at node "a" transitioning from a high state to a low state and a signal at node "b" transitioning from a low state to a high state. The bottom plot illustrates a signal at node out_se_g2 transitioning from a low state to a high state, and a signal at node out_sh_g2 transitioning from a high to a low state.

Figure 22:
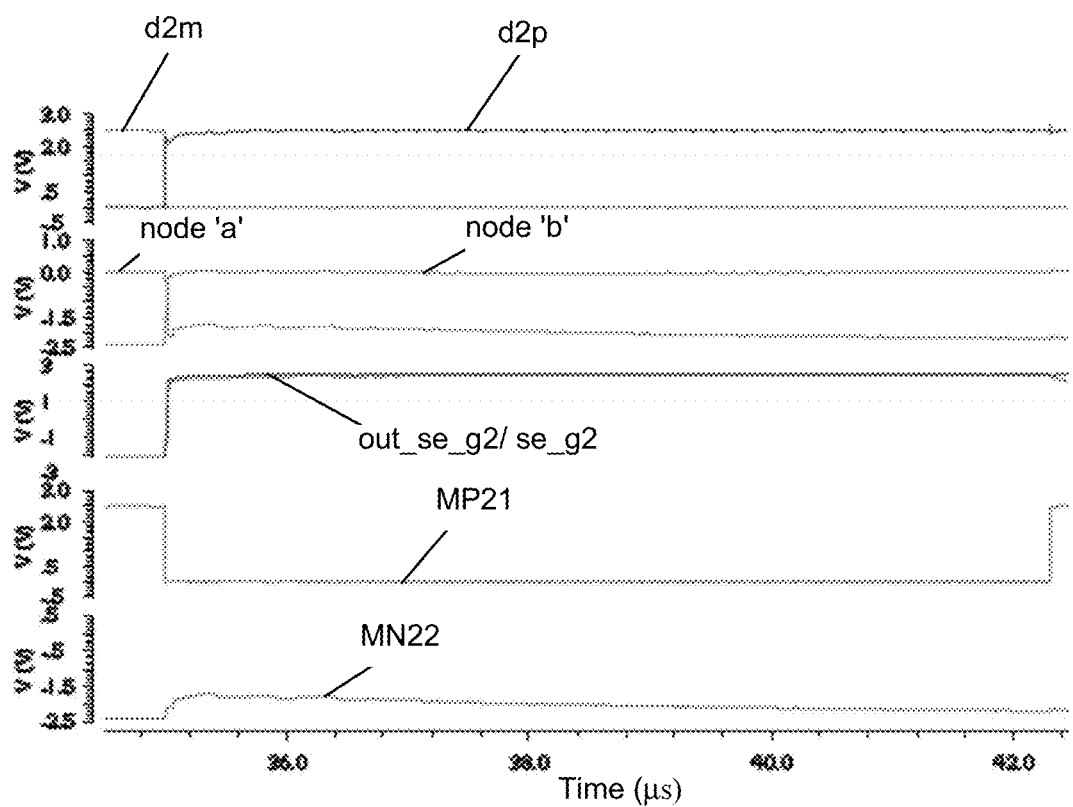
FIG. 22 is a graphical representation from a computer simulation which shows signals associated with the level shifting switch driver of FIG. 12.

The simulation plots of FIG. 22 illustrate the signals controlling the bypass of the filters 156 around the state transition of the control signals C1-C4. The top plot illustrates the control signal d2m which is applied to the MP2 transistor of the level shifting switch driver 122 changing from a high state to a low state and the control signal d2p which is applied to the transistor MP1 changing from a low state to a high state at time t=35 μs. The second plot illustrates a signal at node "a" of the level shifting switch driver 122 transitioning from a high state to a low state and a signal at node "b" transitioning from a low state to a high state. The third plot illustrates a signal at nodes out_se_g2 and se_g2 transitioning from a low state to a high state. The fourth plot illustrates the gate of the transistor MP21 being pulsed low for the duration of approximately 7 μs after the state transition on the control signals C1-C4 occurs. The fifth plot illustrates the gate of the MN22 transistor remaining low for a period of approximately 7 μs after the state transition occurs on the control signals C1-C4. This shows how the transition of the signal at the node se_g2 is not influenced by the resistive load Rf1 of the filter 156A but is instead controlled by the turn on of the transistor MP21 for the duration around the state transition of the control signals C1-C4. This allows the resistive load values Rf1-Rf4 used in the filter 156A-156B to be set independently of switching time requirements.

It will be appreciated by those of ordinary skill in the art that the exemplary computer simulations of FIGS. 18-22 demonstrate that the 1.6MΩ resistive load in the filters 156A-156D does not influence the switching time. The 1.6MΩ filter resistor produces a very low frequency cut off resulting in a high level of attenuation on tones generated within DC domain section 110. The ability of the present teaching to selectively bypass the resistive loads Rf1-Rf4 of the filters 156A-156D during state transitions on the control signals C1-C4 allows the resistive loads Rf1-Rf4 in the filters 156A-156D to be significantly larger than would otherwise be possible. In particular, if the RF switch did not include bypass circuitry in accordance to the present teaching it would not be feasible to use a resistive load of 1.6MΩ in the RF isolation filters 156A-156D as it would produce a time constant as per equation 1 of $\tau$=96 μs which would exceed the switching time requirement by order of magnitude. It will be appreciated by those of ordinary skill in the art that the resistor value of 1.6 MΩ is provided by way of example only, and it is not intended to limit the present teaching to this particular resistance value.

Figure 23:
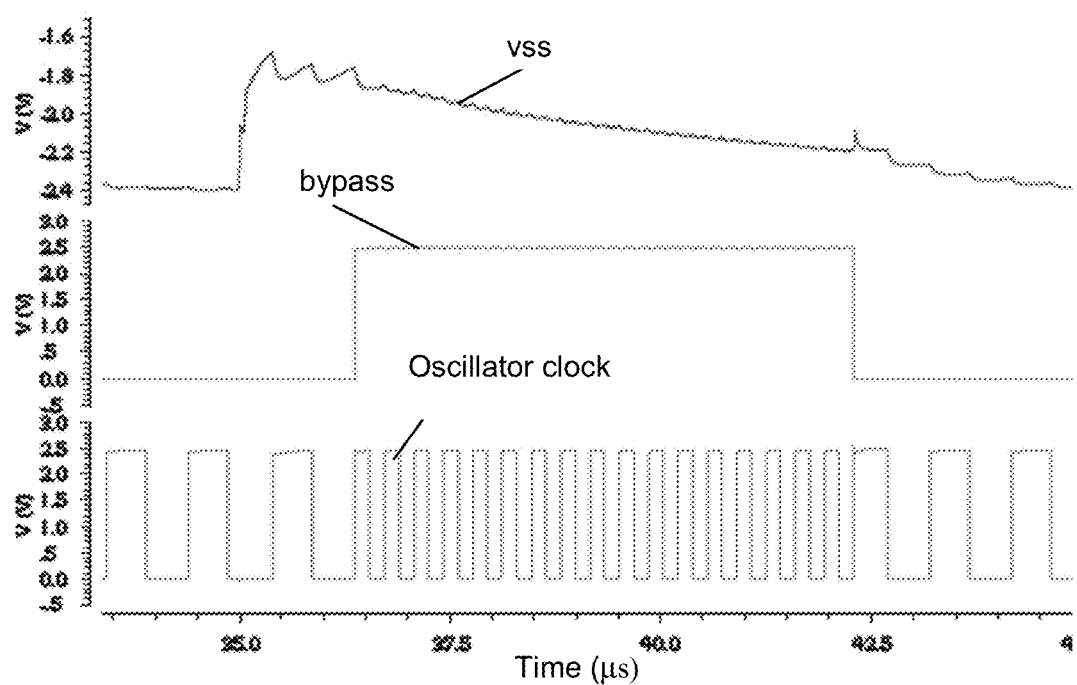
FIG. 23 is a graphical representation from a computer simulation which shows a frequency of an oscillator clock signal being increased.

The simulation plot of FIG. 23 is described with reference to the oscillator 240 of FIG. 17. The top plot shows the temporary disruption on the vss node due to the switching of a state initiated by a state change occurring on the control signals C1-C4 at the time t=35 μs. The middle plot illustrates a bypass signal that is used to control the gate of the NMOS switch MN38 for selectively shorting out the resistor Rbias2. The bypass signal may be generated using the detection stage circuit 220 of FIGS. 15 and 16, or similar type circuitry. The bottom plot illustrates the frequency of the oscillator clock signal being increased when the Rbias2 resistor is shorted out while the bypass signal is pulsed high for duration of approximately 5.5 μs. The bypass signal is on for shorter duration in oscillator 240 due to a delay in synchronising the bypass signal with the oscillator clock signal. The oscillator clock signal is used to drive the negative voltage generator 117 as would be understood by those of ordinary skill in the art. By increasing the frequency of the oscillator clock signal allows the vss negative supply reference to be more quickly re-charged preventing disruption on the vss node from dominating the switching time of the RF switch. As a consequence, the switching time performance of the RF switch is further improved.

While the present teaching has been described with reference to exemplary arrangements and circuits it will be understood that it is not intended to limit the teaching of the present teaching to such arrangements as modifications can be made without departing from the spirit and scope of the present invention. In this way it will be understood that the present teaching is to be limited only insofar as is deemed necessary in the light of the appended claims.

Similarly the words comprises/comprising when used in the specification are used to specify the presence of stated features, integers, steps or components but do not preclude the presence or addition of one or more additional features, integers, steps, components or groups thereof.

We claim:

1. A radio frequency (RF) switch comprising:
   an RF domain section having a plurality of RF switching elements;
   a DC domain section having circuitry configured for controlling the RF switching elements in response to one or more control signals;
   a resistive load provided between the RF domain section and the DC domain section; and
   a bypass circuit configured for selectively bypassing at least a portion of the resistive load,
   wherein the bypass circuit comprises a detection stage for determining when to activate the bypass circuit, and the detection stage is operable for detecting when at least one signal derived from the one or more control signals is transitioning between logic states.

2. An RF switch as claimed in claim 1, wherein the resistive load comprises a resistor element.

3. An RF switch as claimed in claim 2, further comprising at least one filter which includes the resistor element.

4. A RF switch as claimed in claim 3, wherein the resistive load further comprises an equivalent resistance provided between an output node of the filter and a terminal of an RF switching element.

5. An RF switch as claimed in claim 1, wherein the bypass circuit is selectively controlled for bypassing at least a portion of the resistive load at determined time periods.

6. An RF switch as claimed in claim 1, wherein the bypass circuit is selectively controlled for bypassing at least a portion of the resistive load when the one or more control signals are transitioning between logic states.

7. An RF switch as claimed in claim 1, wherein the bypass circuit further comprises a driver output stage.

8. An RF switch as claimed in claim 7, wherein the DC domain section comprises a level shifting switch driver.

9. An RF switch as claimed in claim 8, wherein at least a portion of the resistive load is operably coupled between the level shifting switch driver and the driver output stage.

10. An RF switch as claimed in claim 7, wherein the driver output stage comprises at least one transistor.

11. An RF switch as claimed in claim 10, wherein the driver output stage comprises at least one PMOS transistor stacked on at least one NMOS transistor.

12. An RF switch as claimed in claim 11, wherein the driver output stage comprises a first PMOS transistor and a first NMOS transistor.

13. An RF switch as claimed in claim 12, wherein the driver output stage comprises a second PMOS transistor and a second NMOS transistor.

14. An RF switch as claimed in claim 12, wherein the first PMOS transistor and the first NMOS transistor are selectively controlled.

15. An RF switch as claimed in claim 12, wherein a first logic element is associated with the first PMOS transistor and a second logic element is associated with the first NMOS transistor.

16. An RF switch as claimed in claim 14, wherein the detection stage is configured to generate a bypass control signal which is derived from the one or more control signals for controlling the first PMOS transistor and the first NMOS transistor.

17. An RF switch as claimed in claim 15, wherein the output from the first logic element drives the gate of the first PMOS transistor.

18. An RF switch as claimed in claim 15, wherein the output from the second logic element drives the gate of the first NMOS transistor.

19. An RF switch as claimed in claim 13, wherein the gates of the second PMOS transistor and the second NMOS transistor are operably coupled to a ground reference node.

20. An RF switch as claimed in claim 10, wherein at least a portion of the resistive load is operably coupled to a node intermediate a pair of stacked transistors in the driver output stage.

21. An RF switch as claimed in claim 13, wherein the resistive load is operably coupled to a node intermediate the second PMOS transistor and the second NMOS transistor.

22. An RF switch as claimed in claim 3, wherein the at least one filter is configured for rejecting frequency components in a predetermined range.

23. An RF switch as claimed in claim 22, wherein the at least one filter is configured for rejecting frequency components that are greater than or equal to 1 MHz.

24. An RF switch as claimed in claim 22, wherein the at least one filter further comprises at least one capacitive load, the at least one capacitive load and the resistor element are sized for rejecting frequency components in a predetermined range.

25. An RF switch as claimed in claim 2, wherein the resistor element is sized independently of a switching time associated with the RF switch.

26. An RF switch as claimed in claim 1, wherein the detection stage comprises one or more logic gates.

27. An RF switch as claimed in claim 26, wherein the logic gates are configured to implement an exclusive OR gate function.

28. An RF switch as claimed in claim 1, wherein the detection stage further comprises a flip flop.

29. An RF switch as claimed in claim 28, wherein the detection stage is configured to generate a state change detect signal from the one or more control signals.

30. An RF switch as claimed in claim 29, wherein the state change detect signal provides a clock signal to the flip flop.

31. An RF switch as claimed in claim 30, wherein the detection stage further comprises a reset circuit operably coupled in a feedback loop of the flip flop for generating a reset signal derived from an output signal of the flip flop.

32. An RF switch as claimed in claim 31, wherein the detection stage comprises one or more delay elements for generating one or more delayed control signals.

33. An RF switch as claimed in claim 32, wherein the state change detect signal is derived from the one or more control signals and the one or more delayed control signals.

34. An RF switch as claimed in claim 1, wherein the DC domain section further comprises an oscillator for generating a clock signal, wherein the oscillator includes a biasing stage having a variable resistive load configurable for varying the frequency of the clock signal during determined time periods.

35. An RF switch as claimed in claim 34, wherein the variable resistive load of the biasing stage is varied in response to the at least one signal derived from the one or more control signals transitioning between logic states.

36. An RF switch as claimed in claim 34, wherein the variable resistive load includes at least one resistive element that is selectively shorted out during the determined time periods.

37. A semiconductor substrate having an RF switch circuit fabricated thereon, wherein the RF switch circuit comprises:
an RF domain section having a plurality of RF switching elements;
a DC domain section having circuitry configured for controlling the RF switching elements in response to one or more control signals;
a resistive load provided between the RF domain section and the DC domain section, and
a bypass circuit configured for selectively bypassing at least a portion of the resistive load,
wherein the bypass circuit comprises a detection stage for determining when to activate the bypass circuit, and the detection stage is operable for detecting when at least one signal derived from the one or more control signals is transitioning between logic states.

38. A semiconductor substrate as claimed in claim 37 comprising a silicon-on-insulator arrangement.

39. A method of fabricating an RF switch circuit, the method comprising:
providing an RF domain section having a plurality of RF switching elements on a semiconductor substrate;
providing a DC domain section on the semiconductor substrate having circuitry configured for controlling the RF switching elements in response to one or more control signals;

providing a resistive load between the RF domain section and the DC domain section on the semiconductor substrate, and providing a bypass circuit on the semiconductor substrate which is configured for selectively bypassing at least a portion of the resistive load, wherein the bypass circuit comprises a detection stage for determining when to activate the bypass circuit, and the detection stage is operable for detecting when at least one signal derived from the one or more control signals is transitioning between logic states.

\* \* \* \* \*